United States Patent
Wang et al.

(10) Patent No.: US 9,318,539 B2
(45) Date of Patent: Apr. 19, 2016

(54) ORGANIC LIGHT EMITTING DIODE DISPLAY DEVICE AND MANUFACTURING METHOD THEREOF

(71) Applicant: Samsung Display Co., Ltd., Yongin, Gyeonggi-Do (KR)

(72) Inventors: Seong Min Wang, Yongin-si (KR); Mu Gyeom Kim, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/595,110

(22) Filed: Jan. 12, 2015

(65) Prior Publication Data

US 2015/0200235 A1 Jul. 16, 2015

(30) Foreign Application Priority Data

Jan. 13, 2014 (KR) .................. 10-2014-0004039

(51) Int. Cl.
*H01L 27/32* (2006.01)

(52) U.S. Cl.
CPC ........ *H01L 27/3225* (2013.01); *H01L 27/3246* (2013.01); *H01L 27/3211* (2013.01); *H01L 2251/5338* (2013.01)

(58) Field of Classification Search
CPC ..................................................... H01L 51/56
See application file for complete search history.

(56) References Cited

U.S. PATENT DOCUMENTS

| | | | |
|---|---|---|---|
| 8,004,501 B2 | 8/2011 | Harrison | |
| 8,300,027 B2 | 10/2012 | Kim et al. | |
| 2010/0066681 A1 | 3/2010 | Malabuyo | |
| 2011/0261021 A1 | 10/2011 | Modarres et al. | |
| 2011/0291821 A1 | 12/2011 | Chung | |
| 2013/0016053 A1 | 1/2013 | Jung | |
| 2013/0265256 A1* | 10/2013 | Nathan | G06F 3/0414 345/173 |
| 2014/0362000 A1* | 12/2014 | Seo | G09G 3/00 345/173 |
| 2015/0028343 A1* | 1/2015 | Li | H01L 27/124 257/72 |

FOREIGN PATENT DOCUMENTS

| | | |
|---|---|---|
| JP | 2012-203552 A | 10/2012 |
| KR | 10-2010-0074820 A | 7/2010 |
| KR | 10-1075204 B1 | 10/2011 |
| KR | 10-1109226 B1 | 1/2012 |

* cited by examiner

*Primary Examiner* — Jerome Jackson, Jr.
*Assistant Examiner* — Ankush Singal
(74) *Attorney, Agent, or Firm* — Knobbe Martens Olson & Bear LLP

(57) ABSTRACT

An organic light emitting diode display and a manufacturing method thereof are disclosed. The organic light emitting diode display includes: a flexible upper substrate; a first piezoelectric material layer and a second piezoelectric material layer formed inside the upper substrate; a pair of first electrodes brought into contact with the first piezoelectric material layer; a pair of second electrodes brought into contact with the second piezoelectric material layer; a flexible lower substrate disposed to face the upper substrate, and to have an organic light emission layer; and an opposed electrode disposed to protrude toward an inner side of the lower substrate and to face the pair of second electrodes, wherein a first sensor includes the first piezoelectric material layer and the pair of first electrodes, and a second sensor includes the second piezoelectric material layer, the pair of second electrodes, and the opposed electrode.

21 Claims, 20 Drawing Sheets

ORGANIC LIGHT EMITTING DIODE DISPLAY DEVICE AND MANUFACTURING METHOD THEREOF

CROSS-REFERENCE TO RELATED APPLICATION

This application claims priority to and the benefit of Korean Patent Application No. 10-2014-0004039 filed in the Korean Intellectual Property Office on Jan. 13, 2014, the entire contents of which are incorporated herein by reference.

BACKGROUND

1. Field

The present embodiments relate to an organic light emitting diode display and a manufacturing method thereof, and to an organic light emitting diode display including a sensor and a manufacturing method thereof.

2. Description of the Related Art

A flat panel display which displays an image includes a liquid crystal display and an organic light emitting diode display which have drawn attention in recent years, and further includes an electrophoretic display, a plasma display device, an electrowetting display device, and a MEMS display device.

Among them, the organic light emitting diode display, which has drawn attention in recent years, has a self-emission characteristic and thus does not require a separate light source, differently from the liquid crystal display, so that thickness and weight thereof may be reduced. Further, the organic light emitting diode display shows high quality characteristics such as low power consumption, high luminance, and high response speed.

This organic light emitting diode display may be bendably manufactured by using a plastic substrate, and may include a touch function for sensing a touch. However, the organic light emitting diode display has difficulty in performing a specific operation requiring a bending characteristic thereof.

The above information disclosed in this Background section is only for enhancement of understanding of the background of the embodiments and therefore it may contain information that does not form the prior art that is already known in this country to a person of ordinary skill in the art.

SUMMARY

The present embodiments have been made in an effort to provide an organic light emitting diode display having advantages of being capable of sensing a pressure and performing a specific operation requiring a bending characteristic thereof.

An example embodiment provides an organic light emitting diode display including: a flexible upper substrate; a first piezoelectric material layer and a second piezoelectric material layer formed inside the upper substrate; a pair of first electrodes brought into contact with the first piezoelectric material layer; a pair of second electrodes brought into contact with the second piezoelectric material layer; a flexible lower substrate disposed to face the upper substrate, and to have an organic light emission layer; and an opposed electrode disposed to protrude toward an inner side of the lower substrate and to face the pair of second electrodes, wherein a first sensor includes the first piezoelectric material layer and the pair of first electrodes, and a second sensor includes the second piezoelectric material layer, the pair of second electrodes, and the opposed electrode.

Pixels including the organic light emission layer may be arranged in a matrix shape in the lower substrate, and the first sensor and the second sensor may be formed to cross between the pixels in a vertical direction.

Each pixel may include a red pixel, a green pixel, and a blue pixel, and the first sensor or the second sensor may be disposed in every unit pixel including the red pixel, the green pixel, and the blue pixel.

The pair of first electrodes may include an upper electrode positioned above the first piezoelectric material layer and a lower electrode positioned below the first piezoelectric material layer, the pair of second electrodes may include an upper electrode positioned above the second piezoelectric material layer and a lower electrode positioned below the second piezoelectric material layer, and the lower electrode pertaining to the pair of the first electrodes may be electrically separated from the lower electrode pertaining to the pair of second electrodes.

The lower substrate may further include a pixel definition layer having an opening and a projection, and a protrusion electrode formed on the projection, the protrusion electrode may be used as the opposed electrode, and the protrusion electrode may be formed at a portion corresponding to the lower electrode pertaining to the pair of second electrodes.

The upper electrode pertaining to the pair of first electrodes and the upper electrode pertaining to the pair of second electrodes may be connected to each other, and may be made of a transparent conductive material.

The pair of first electrodes may include a pair of lower electrodes positioned below the first piezoelectric material layer, and the pair of second electrodes may include a pair of lower electrodes positioned below the second piezoelectric material layer.

The lower substrates may further include a pixel definition layer having an opening and a projection, and a protrusion electrode formed on the projection, the protrusion electrode may be used as the opposed electrode, and the protrusion electrode may be formed at a portion corresponding to the lower electrode pertaining to the pair of second electrodes.

The lower substrates may further include a pixel definition layer having an opening and a conductive spacer formed on the pixel definition layer, the conductive spacer may be used as the opposed electrode, and the conductive spacer may be formed at a portion corresponding to the lower electrode pertaining to the pair of second electrodes.

The first sensor may expand or reduce a screen according to a bending direction of the organic light emitting diode display, and the second sensor may be vibrated when the organic light emitting diode display is pressed.

One of the pair of first electrodes and one of the pair of second electrodes may be made of the same material, and the other one of the pair of first electrodes and the other one of the pair of second electrodes are made of the same material.

Another example embodiment provides a manufacturing method of an organic light emitting diode display including: forming a first piezoelectric material layer and a second piezoelectric material layer inside a flexible upper substrate by using a piezoelectric material; forming a first electrode inside the first piezoelectric material layer and a second electrode inside the second piezoelectric material layer; forming a pixel definition layer having an opening by stacking an organic material inside a flexible lower substrate and performing exposure thereon; forming a conductive spacer on the pixel definition layer; forming an organic light emission layer in the opening of the pixel definition layer; and forming a common electrode to cover the pixel definition layer and organic light emission layer except at the projection and a protrusion electrode.

The manufacturing method may further include forming an upper electrode between the upper substrate and the first piezoelectric material layer and the second piezoelectric material layer to be paired with the first electrode and the second electrode, respectively, by using a transparent conductive material.

The first electrode may include a pair of first electrodes, and the second electrode may include a pair of second electrodes.

The forming of the first piezoelectric material layer and the second piezoelectric material layer may be performed by depositing the piezoelectric material and crystallizing it with a laser when the piezoelectric material is an inorganic material, and may be performed without crystallizing it with a laser when the piezoelectric material is an organic material.

Yet another example embodiment provides a manufacturing method of an organic light emitting diode display, including: forming a first piezoelectric material layer and a second piezoelectric material layer inside a flexible upper substrate by using a piezoelectric material; forming a first electrode inside the first piezoelectric material layer and a second electrode inside the second piezoelectric material layer; forming a pixel definition layer having an opening and a projection by stacking an organic material inside a flexible lower substrate and performing halftone-exposure thereon; forming a protrusion electrode on the pixel definition layer; forming an organic light emission layer in the opening of the pixel definition layer; and forming a common electrode to cover the pixel definition layer and organic light emission layer except at the projection and the protrusion electrode.

The manufacturing method may further include forming an upper electrode between the upper substrate and the first piezoelectric material layer and the second piezoelectric material layer to be paired with the first electrode and the second electrode, respectively, by using a transparent conductive material.

The first electrode may include a pair of first electrodes, and the second electrode may include a pair of second electrodes.

The forming of the first piezoelectric material layer and the second piezoelectric material layer may be performed by depositing the piezoelectric material and crystallizing it with a laser when the piezoelectric material is an inorganic material, and may be performed without crystallizing it with a laser when the piezoelectric material is an organic material.

In accordance with the example embodiments, the organic light emitting diode display can include the sensors having the piezoelectric material layers to perform a specific operation by sensing the bending thereof. Further, the organic light emitting diode display can perform different operations according to a bending direction thereof. In the organic light emitting diode display, a sensor having a piezoelectric material layer can sense a pressing pressure to provide vibration. The organic light emitting diode display can individually sense the bending and the pressure.

DETAILED DESCRIPTION OF THE PREFERRED EMBODIMENT

Figure 1:
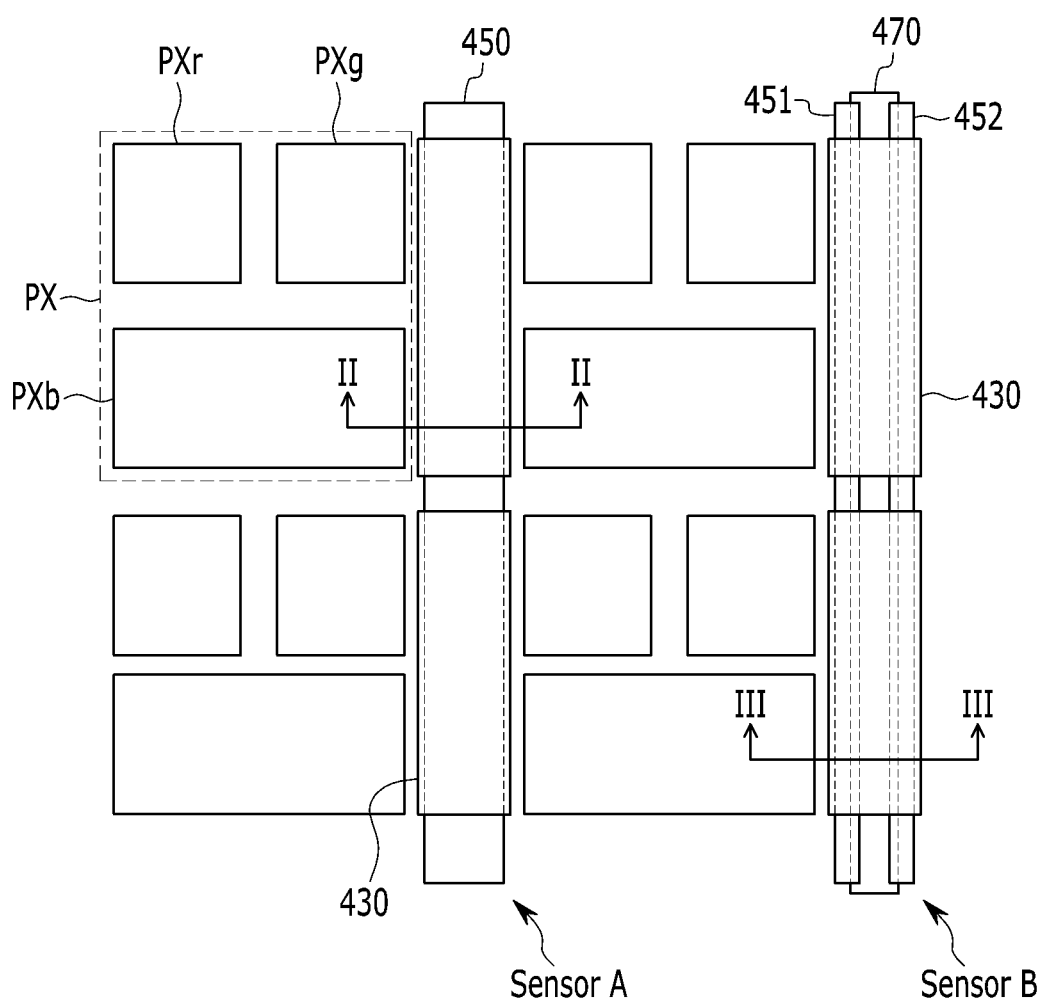
FIG. 1 is a layout view showing a pixel and a sensor in an organic light emitting diode display in accordance with an example embodiment.

The present embodiments will be described more fully hereinafter with reference to the accompanying drawings, in which example embodiments are shown. As those skilled in the art would realize, the described embodiments may be modified in various different ways, all without departing from the spirit or scope of the present embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an organic light emitting diode display in accordance with an example embodiment will be described in detail with reference to FIG. 1 to FIG. 3.

Figure 2:
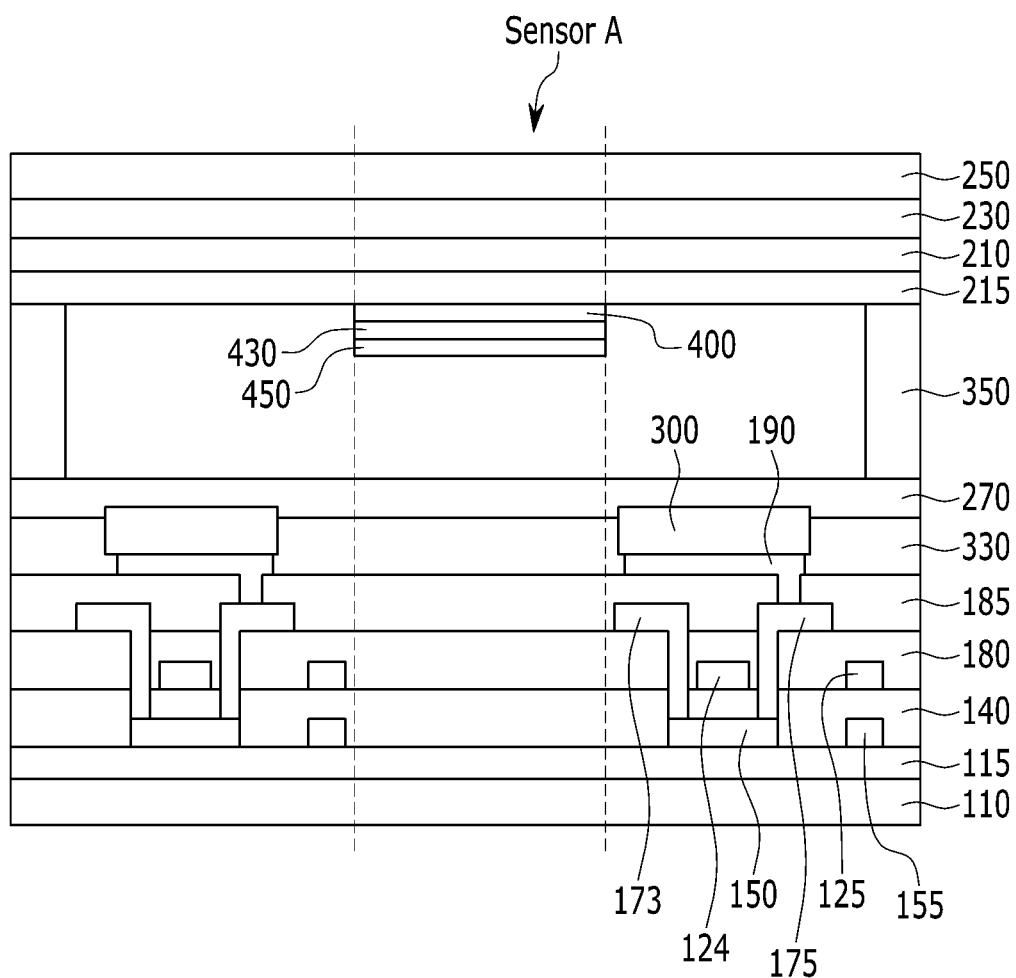
FIG. 2 is a cross-sectional view taken along a line II-II of FIG. 1.
Figure 3:
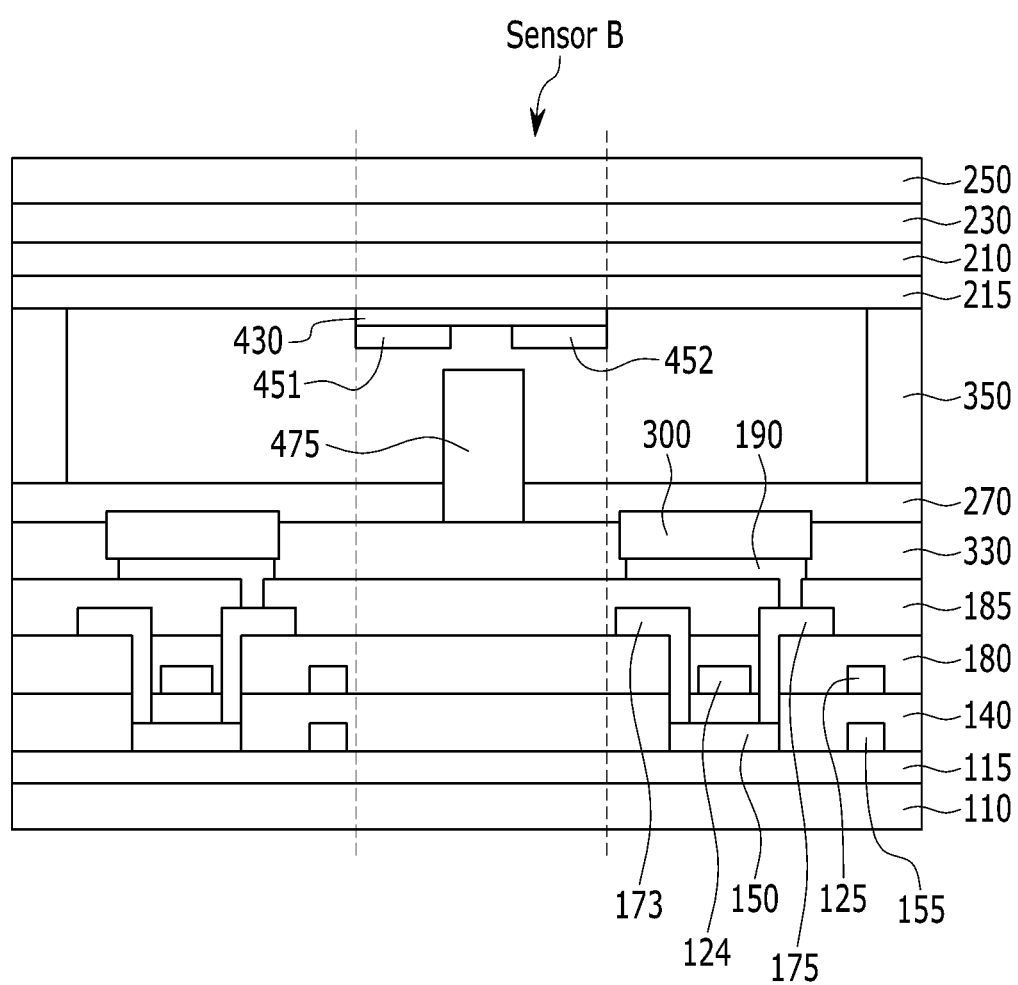
FIG. 3 is a cross-sectional view taken along a line III-III of FIG. 1.

FIG. 1 is a layout view showing a pixel and a sensor in the organic light emitting diode display in accordance with the example embodiment, FIG. 2 is a cross-sectional view taken along a line II-II of FIG. 1, and FIG. 3 is a cross-sectional view taken along a line III-III of FIG. 1.

As illustrated in FIG. 1, the organic light emitting diode display of the present example embodiment includes a red pixel PXr, a green pixel PXg, and a blue pixel PXb in a unit pixel PX.

The red pixel PXr and the green pixel PXg are positioned to be horizontally adjacent to each other, and the blue pixel PXb is located below the red pixel PXr and the green pixel PXg. The widths of the red pixel PXr and the green pixel PXg are narrower than that of the blue pixel PXb, and the width of the blue pixel PXb corresponds to the widths of the red pixel PXr and the green pixel PXg and the distance therebetween. An arrangement of pixels in the unit pixel PX shown in FIG. 1 may be varied depending on the example embodiments.

Unit pixels PX having the aforementioned structure are arranged in a matrix shape in row and column directions.

The organic light emitting diode display in accordance with the present example embodiment includes two sensors A and B extended in a vertical direction. In an example of FIG. 1, the sensor A or the sensor B is disposed every row of unit pixel, and the sensor A and the sensor B are alternately disposed. Alternatively, the sensor A or the sensor B may be disposed every several rows.

The sensor A serves as a bending sensing sensor including a piezoelectric material layer, and the sensor B serves as a pressing sensing sensor including a piezoelectric material layer. The sensor A includes a pair of electrodes and one piezoelectric material layer 430, and is positioned inside an upper insulation substrate 210. The sensor B includes three electrodes and one piezoelectric material layer 430, one electrode (a conductive spacer 475) is located inside a lower insulation substrate 110 to protrude upwardly, and the other electrodes are located inside the upper insulation substrate 210 and below the piezoelectric material layer 430. In an example of FIG. 3, the sensor B includes three electrodes and one piezoelectric material layer 430, wherein one electrode is a conductive spacer 475 located inside the lower insulation substrate 110, and the remaining pair of electrodes 451 and 452 are located inside the upper insulation substrate 210, In accordance with another example embodiment, the sensor B may only include a pair of electrodes. In this case, the pair of electrodes may be disposed to be separated from each other, and may be brought into contact with each other when one of the electrodes is pressed.

The sensors A and B may be extended in a vertical direction to an end of a display area of the organic light emitting diode display.

FIG. 2 is a cross-sectional view shown based on the sensor A, and FIG. 3 is a cross-sectional view shown based on the sensor B.

First, the structure of the pixel PX (the red pixel PXr, the green pixel PXg, and the blue pixel PXb) will be described with reference to FIG. 2 and FIG. 3.

One pixel includes an organic light emission layer 300, a pixel electrode 190 positioned below the organic light emission layer 300, and a common electrode 270 positioned above the organic light emission layer 300. The pixel electrode 190 may be separately formed in every pixel, and the common electrode 270 may be formed as a single unit in all the pixels.

The pixel electrode 190 may be connected to an output terminal (drain electrode) of a thin film transistor such as a driving transistor to receive an output current of the driving transistor.

The thin film transistor such as the driving transistor includes a polycrystalline semiconductor layer 150, a source electrode 173, a drain electrode 175, and a gate electrode 124.

One pixel may include a capacitor connected to the gate electrode 124 and the source electrode 173 of the driving transistor. The capacitor may comprise a doped polycrystalline semiconductor 155, an upper capacitor electrode 125 made of the same material at the same layer as those of the gate electrode 124, and an insulating layer (gate insulating layer 140) positioned therebetween.

One pixel is illustrated as including one thin film transistor in FIG. 2 and FIG. 3, but actually includes at least two thin film transistors. When a pixel includes the minimum number of thin film transistors, the pixel only includes a switching transistor and a driving transistor, and may further include a light emission transistor for adjusting a light emission time of the organic light emission layer 300.

The lower panel of the above-mentioned structure will be sequentially described as follows.

A buffer layer 115 is formed on the lower insulation substrate 110. Herein, the lower insulation substrate 110 is made of a flexible material such as plastic. The polycrystalline semiconductor layer 150 and the doped polycrystalline semiconductor 155 are formed on buffer layer 115. The doped polycrystalline semiconductor 155 may have a conductive layer characteristic by high-concentration doping instead of a semiconductor characteristic. The buffer layer 115 serves to prevent inflow of impurities from the lower insulation substrate 110 into the semiconductor when a crystallization process is performed to form a polycrystalline semiconductor.

The polycrystalline semiconductor layer 150, the doped polycrystalline semiconductor 155, and the exposed buffer layer 115 are covered by the gate insulating layer 140. The gate insulating layer 140 may made of an inorganic material or an organic material.

The gate electrode 124 and the upper capacitor electrode 125 are formed on the gate insulating layer 140. The gate electrode 124 is partially overlapped with the polycrystalline semiconductor layer 150, and the upper capacitor electrode 125 is overlapped with the doped polycrystalline semiconductor 155.

The gate electrode 124, the upper capacitor electrode 125, and the exposed gate insulating layer 140 are covered with an interlayer insulating layer 180. The interlayer insulating layer 180 may be made of an organic material or an inorganic material.

The interlayer insulating layer 180 and the gate insulating layer 140 expose a source region and a drain source of the polycrystalline semiconductor layer 150 through a contact hole. The source electrode 173 and the drain electrode 175 are formed on the interlayer insulating layer 180, and the contact hole and its periphery. The source electrode 173 contacts the source region of the polycrystalline semiconductor layer 150, and the drain electrode 175 contacts the drain region of the polycrystalline semiconductor layer 150.

A passivation layer 185 is formed on the source electrode 173, the drain electrode 175, and the interlayer insulating layer 180. The passivation layer 185 is made of an organic material or an inorganic material. The passivation layer 185 has a contact hole through which the drain electrode 175 is exposed. The pixel electrode 190 is formed on the passivation layer 185, and the contact hole and its periphery. The pixel electrode 190 is connected to the drain electrode 175 through the contact hole.

A pixel definition layer (PDL) 330 is formed around the pixel electrode 190, and includes a plurality of openings corresponding to one pixel. The pixel electrode 190 is exposed at a portion at which no pixel definition layer 330 is formed, and the organic light emission layer 300 is positioned on the pixel electrode 190. The organic light emission layer 300 may include a plurality of organic layers to emit light of different colors depending on kinds of the organic material.

Figure 6:
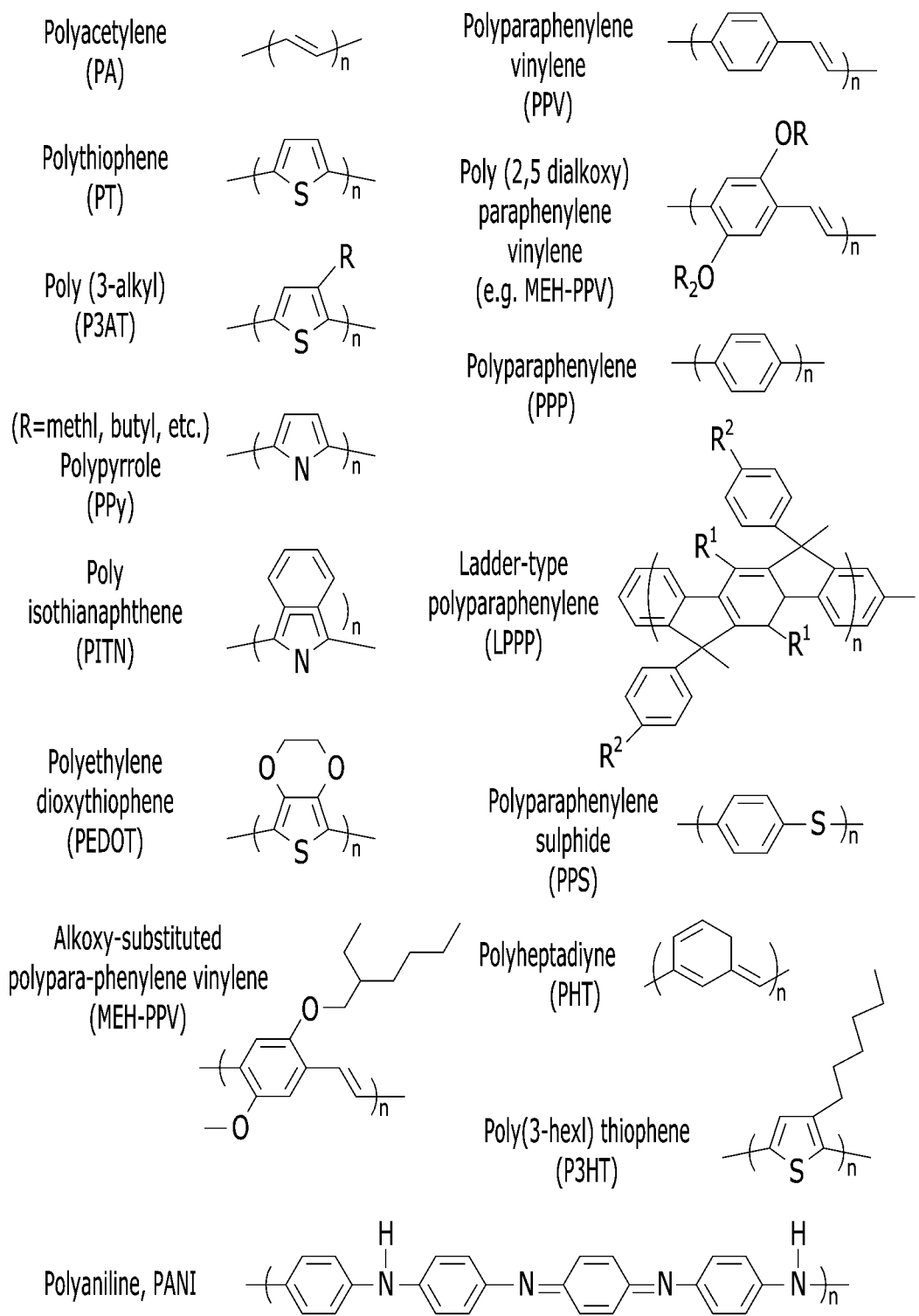
FIG. 6 shows examples of conductive polymer materials in accordance with the present example embodiment.

Referring to FIG. 3, a conductive spacer 475 is formed on a part of the pixel definition layer 330. A conductive organic material may be used as the conductive spacer 475. An example thereof is shown in FIG. 6

The conductive spacer 475 is extended in the vertical direction. Alternatively, the conductive spacer 475 may be extended to cross an entire area of the display area in accordance with another example embodiment. Further, the conductive spacer 475 may have a disconnected portion at regions of the display area in accordance with yet another example embodiment.

The organic light emission layer 300 and the pixel definition layer 330 are covered by the common electrode 270, except at the conductive spacer 475. In the present example embodiment, the conductive spacer 475 is in side contact with the common electrode 270 so as to transfer a common voltage to the conductive spacer 475. In the present example embodiment, the common voltage ranges from −1 V to −3 V.

At least one of the pixel electrode 190 and the common electrode 270 is made of a transparent conductive material. This is to provide light emitted from the organic light emission layer 300 to the eye of a user through the transparent conductive material. In organic light emitting diode display of the present example embodiment, the common electrode 270 may be made of a transparent conductive material, and the pixel electrode 190 may be made of an opaque metal.

The lower panel has such a layered structure.

Hereinafter, a structure of the upper panel will be described.

First, a touch screen panel 230 is attached on the upper insulation substrate 210. Herein, the lower insulation substrate 110 is made of a flexible material such as plastic.

The touch screen panel 230 may have such a structure so as to sense a hand touch in various ways such as an optical type, a resistive type, a contact type, and a capacitive type. However, the touch screen panel 230 may not be attached thereto.

A window 250 for protecting the touch screen panel 230 and the lower panel is attached on the window 250. The window 250 and the touch screen panel 230 are also flexible.

An upper buffer layer 215 is formed inside the buffer layer 215.

This structure is used to support and protect the sensor A and sensor B, and may be varied depending on the example embodiments.

Hereinafter, each structure of the sensor A and the sensor B will be described.

First, a cross-sectional structure of the sensor A is shown in FIG. 2.

The sensor A include an upper electrode 400 formed inside the buffer layer 215. The upper electrode 400 is made of a transparent conductive material, and is formed to vertically extend below the buffer layer 215. Further, the upper electrode 400 is formed to correspond to a portion at which the pixel definition layer 330 of the lower panel is positioned. This is to prevent the opening of the pixel definition layer 330 from being covered since the light emitted from the organic light emission layer 300 passes through the opening. The upper electrode 400 may be entirely formed inside the buffer layer 215 in accordance with another example embodiment. The upper electrode 400 may be made of a transparent conductive material such as ITO, IZO, GIZO, carbon nanotubes, or graphene.

The piezoelectric material layer 430 is positioned below the upper electrode 400. The piezoelectric material layer 430 is formed to correspond to a portion at which the pixel definition layer 330 of the lower panel is formed. This is also to prevent the opening of the pixel definition layer 330 from being covered since the light emitted from organic light emission layer 300 passes through the opening. Referring to FIG. 1, the pixel definition layer 330 is formed to vertically extend, and has a length corresponding to the length of the pixel PX. Alternatively, the pixel definition layer 330 may be formed to vertically extend to correspond to the length of several pixels, several tens of pixels, or all the pixels. The piezoelectric material layer 430 includes a piezoelectric material, and may include a material such as $BaTiO_3$, $SrTiO_3$, $PbTiO_3$, and $CaTiO_3$. Further, the piezoelectric material layer 430 may include an organic material such as PVDF. Herein, when an organic material (e.g., PVDF) is employed as the piezoelectric material layer 430, it is not necessary to perform a laser crystallization process on the piezoelectric material layer 430. When an inorganic material is employed as the piezoelectric material layer 430, it is necessary to perform the laser crystallization process on the piezoelectric material layer 430.

A lower electrode 450 is positioned below the piezoelectric material layer 430. The lower electrode 450 is formed to correspond to a portion at which the pixel definition layer 330 of the lower panel is formed. The lower electrode 450 may comprise an opaque metal layer made of an opaque metal such as Mo, Cu, Cr, Ti, and W.

As a result, the sensor A includes the upper electrode 400 and the lower electrode 450 as a pair of electrodes with the piezoelectric material layer 430 positioned therebetween. In the present example embodiment, in the piezoelectric material layer 430, a plurality of unit structures are arranged in the vertical direction, and the upper electrode 400 and the lower electrode 450 are formed to vertically cross the entire display area.

A cross-sectional structure of the sensor B is shown in FIG. 3.

The sensor B includes the piezoelectric material layer 430 formed inside the buffer layer 215. The piezoelectric material layer 430 is formed to correspond to a portion at which the pixel definition layer 330 of the lower panel is formed. This is also to prevent the opening of the pixel definition layer 330 from being covered since the light emitted from organic light emission layer 300 passes through the opening. The piezoelectric material layer 430 is formed to vertically extend, and has a length corresponding to the length of the pixel PX. Alternatively, the pixel definition layer 330 may be formed to vertically extend to correspond to the length of several pixels, several tens of pixels, or all the pixels.

The pair of lower electrodes 451 and 452 is positioned below the piezoelectric material layer 430. The pair of lower electrodes 451 and 452 are formed to correspond to a portion at which the pixel definition layer 330 of the lower panel is formed and to extend in the vertical direction while partially coming into contact with the piezoelectric material layer 430. The pair of lower electrodes 451 and 452 are extended to vertically extend at a portion at which the piezoelectric material layer 430 is not formed, and may be made of an opaque metal layer.

Further, the sensor B may include the conductive spacer 475 positioned in the lower panel.

As a result, the sensor B includes the pair of lower electrodes 451 and 452 and the conductive spacer 475 as three electrodes, and the piezoelectric material layer 430 positioned above the pair of lower electrodes 451 and 452. In the present example embodiment, in the piezoelectric material layer 430, a plurality of unit structures that are vertically extended are arranged in the vertical direction, and the pair of lower electrodes 451 and 452 are formed to vertically cross the entire display area. Further, the conductive spacer 475 is also vertically extended in the lower panel.

The pair of lower electrodes 451 and 452 may be made of an opaque metal layer made of Mo, Cu, Cr, Ti, or W, for example.

Hitherto, the structure of the upper panel has been described.

The lower panel and the upper panel are attached by using a sealing member 350, and the inside is sealed.

Hereinafter, a manufacturing method of main parts of the organic light emitting diode display having the aforementioned structure will be briefly described with reference to FIG. 4 and FIG. 5.

Figure 4:
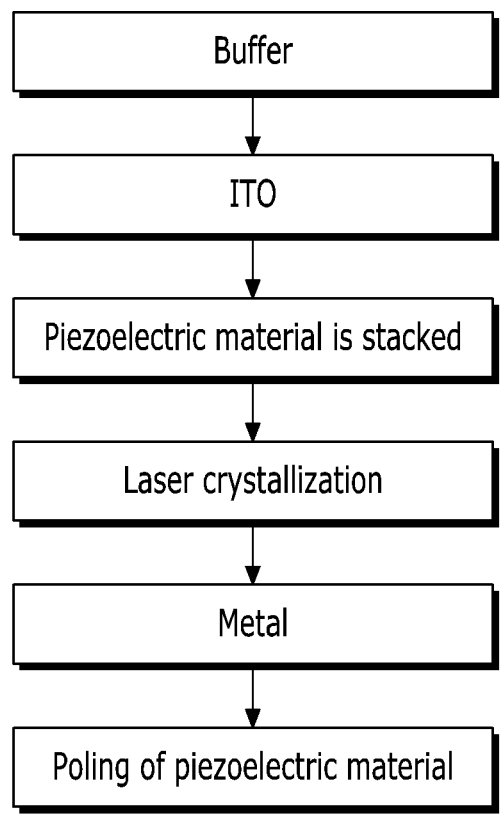
FIG. 4 and FIG. 5 are flowcharts briefly showing a manufacturing method in accordance with an example of FIG. 1.
Figure 5:
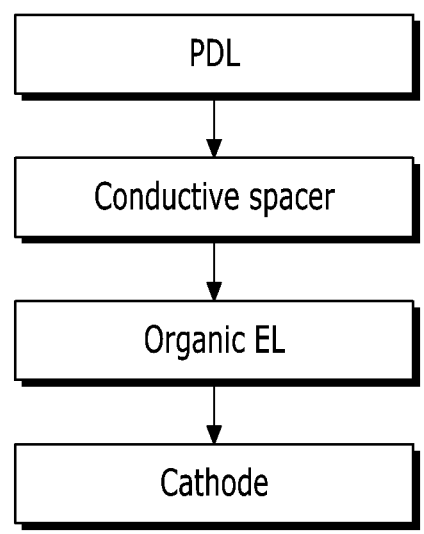

FIG. 4 and FIG. 5 are flowcharts briefly showing a manufacturing method in accordance with an example of FIG. 1.

FIG. 4 shows a flowchart illustrating a manufacturing method of the upper panel.

The buffer layer 215 is formed inside the upper insulation substrate 210. Then, the upper electrode 400 made of a transparent conductive material such as ITO is formed inside the buffer layer 215.

Then, a vibration material such as piezoelectric material is stacked. Next, the stacked vibration material is crystallized by using a laser. The crystallized vibration material is etched to complete it as the piezoelectric material layer 430. The reason for crystallizing it by using a laser is to prevent the upper insulation substrate 210 made of a flexible material such as plastic from being affected by a high temperature treatment, and the buffer layer 215 is also formed to protect the upper insulation substrate 210.

When an organic material such as PVDF is employed as the piezoelectric material layer 430, it is not necessary to perform a laser crystallization process. In the case of using no laser crystallization process, the upper insulation substrate 210 may be less affected by a high temperature. Accordingly, the buffer layer 215 may not be provided in accordance with another example embodiment.

An ITO that can be used as the upper electrode 400 can be crystallized along with the vibration material by the laser crystallization process. If the ITO is cracked or contaminated by the laser crystallization process, an example of FIG. 11 can be applied.

Thereafter, the lower electrode 450 is formed, and the piezoelectric material layer 430 may be subjected to a high temperature treatment through a poling process. However, the poling process may be omitted since the laser crystallization process has already been performed.

FIG. 5 is a flowchart briefly showing a manufacturing method of the lower panel.

FIG. 5 illustrates an order of forming the conductive spacer 475 in detail.

A material for the pixel definition layer 330 is stacked and exposed to form the pixel definition layer 330 having an opening. No projection is formed in the pixel definition layer 330.

Then, a conductive organic material is stacked and etched to form the conductive spacer 475.

Next, the organic light emission layer 300 is formed in the opening of the pixel definition layer 330.

Thereafter, the common electrode (cathode) 270 is formed to cover the organic light emission layer 300 and the pixel definition layer 330 except at the conductive spacer 475.

As shown in FIG. 5, the organic light emission layer 300 and the common electrode 270 are formed after the conductive spacer 475 is formed. Alternatively, the conductive spacer 475 may be formed after the organic light emission layer 300 is formed in accordance with another example embodiment. However, when the conductive spacer 475 is formed later, the organic light emission layer 300 may be deteriorated or contaminated. It is therefore advantageous to form the conductive spacer 475 first for obtaining the characteristic of the organic light emission layer 300.

As described above, the organic light emitting diode display includes two sensors, for example, the sensor A (referred to as a first sensor) for sensing bending and the sensor B (referred to as a second sensor) for sensing pressing.

The sensor A includes a piezoelectric material layer (referred to as a first piezoelectric material layer) and a pair of electrodes (referred to as a pair of first electrodes) which come into contact therewith, and the sensor B includes a piezoelectric material layer (referred to as a second piezoelectric material layer), a pair of electrodes (referred to as a pair of second electrodes) formed in a substrate, and an opposed electrode (a protrusion electrode or a conductive spacer) formed in an opposed substrate.

Figure 7:
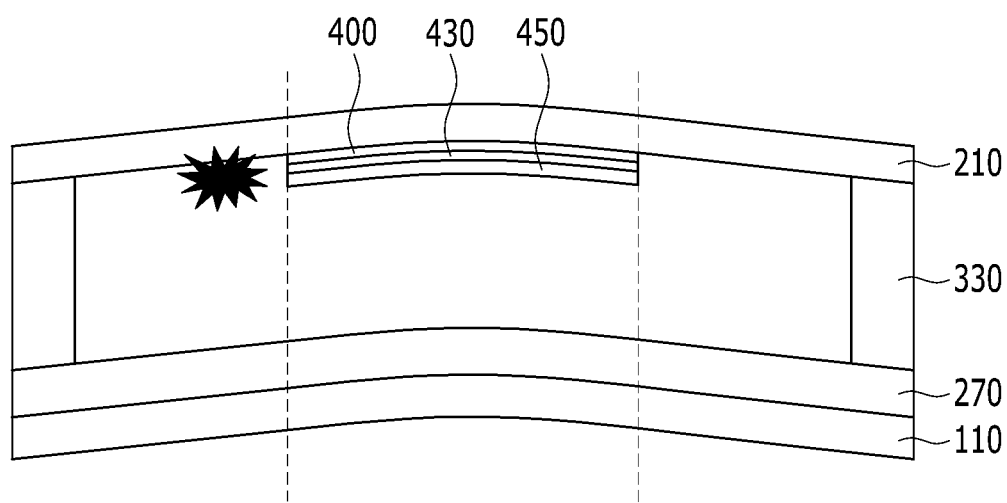
FIG. 7 shows how the organic light emitting diode display is bent in accordance with the present example embodiment.
Figure 8:
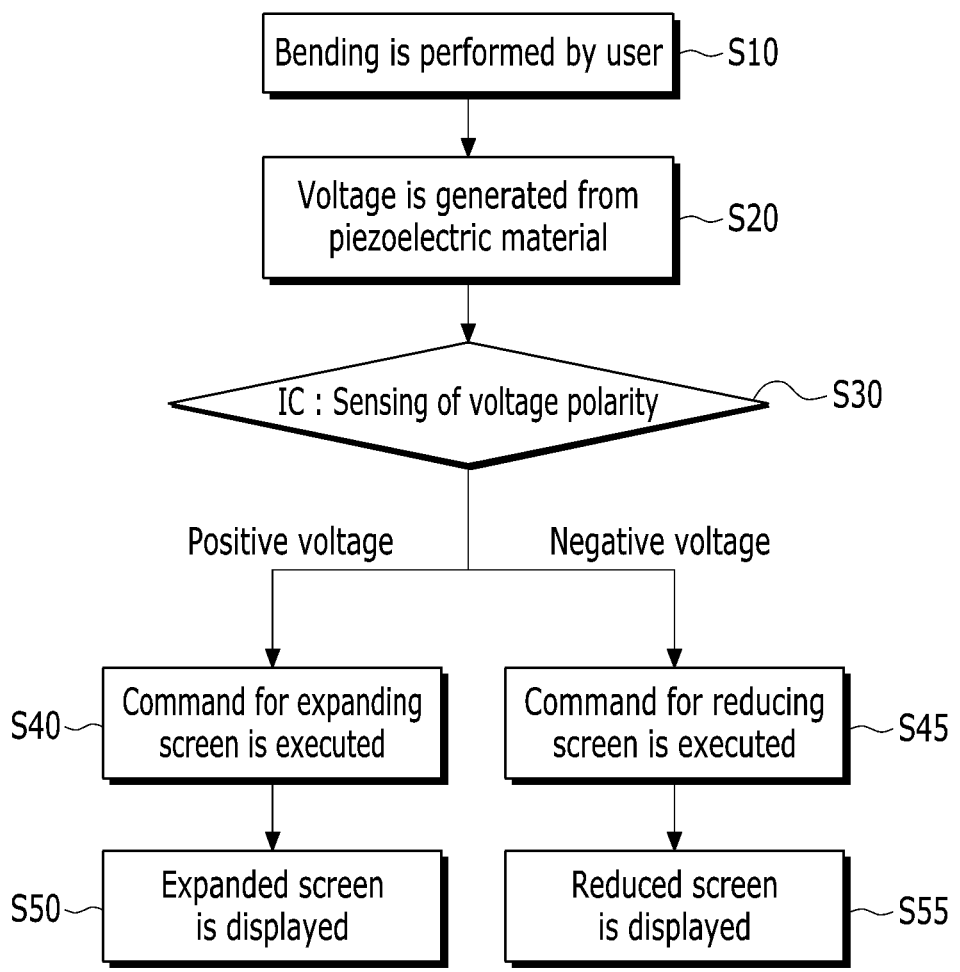
FIG. 8 is a flowchart showing bending sensing and its operation when the organic light emitting diode display is bent in accordance with the present example embodiment.
Figure 9:
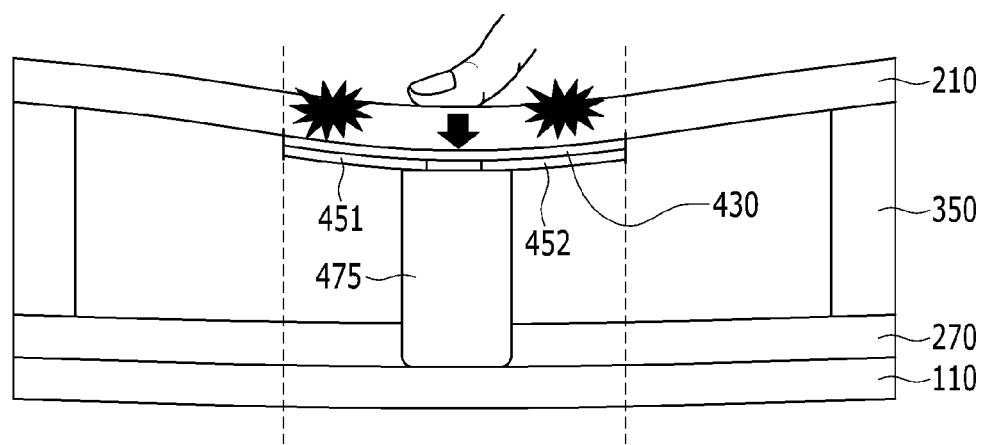
FIG. 9 shows how the organic light emitting diode display is pressed in accordance with the present example embodiment.
Figure 10:
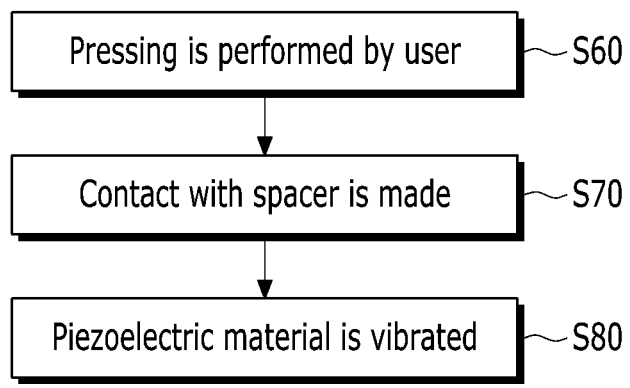
FIG. 10 is a flowchart showing pressing sensing and its operation when the organic light emitting diode display is pressed in accordance with the present example embodiment.

The organic light emitting diode display manufactured by using the aforementioned structure and manufacturing method can serve to sense bending as shown in FIG. 7 and FIG. 8 and serve to sense pressing as shown in FIG. 9 and FIG. 10.

First, a sensing operation of bending will be described with reference to FIG. 7 and FIG. 8.

FIG. 7 shows how the organic light emitting diode display is bent in accordance with the present example embodiment, and FIG. 8 is a flowchart showing bending sensing and its operation when the organic light emitting diode display is bent in accordance with the present example embodiment.

As shown in FIG. 7, an insulation substrate of the organic light emitting diode display is made of a material such as plastic to be flexible. When the organic light emitting diode display is bent, an electric signal is generated from the piezoelectric material layer 430 of the sensor A, and is sensed through the lower electrode 450. This is because an electrical signal is generated if the piezoelectric material layer 430 is deformed. The organic light emitting diode display is bendable in the direction shown in FIG. 7 or the opposite direction. In this case, since the piezoelectric material layer 430 generates different electrical signals depending on the bending direction, the sensor A can sense in which direction the piezoelectric material layer 430 is bent. Further, since an amount of the generated electrical signal is changed according to the bent degree, the sensor A can sense the bent degree.

FIG. 8 is a flowchart showing an example of a sensing operation of the sensor A.

First, when the organic light emitting diode display is bent by a user (S10), a voltage is generated by the piezoelectric material layer 430 included in the sensor A (S20).

A sensing unit (not shown) which receives the voltage through the lower electrode 450 of the sensor A determines whether the polarity of the voltage is positive or negative (S30).

When the polarity of the voltage is positive, a predetermined operation is performed. In an example of FIG. 7, a screen is expanded. Specifically, when the positive voltage is received, a command for expanding the screen is executed (S40) since screen expanding is required. Accordingly, an expanded screen image is displayed on the organic light emitting diode display (S50).

Similarly when the polarity of the voltage is negative, a predetermined operation is performed. In the example of FIG. 7, the screen is reduced. Specifically, when the negative voltage is received, a command for reducing the screen is executed (S45) since screen reducing is required. Accordingly, a reduced screen image is displayed on the organic light emitting diode display (S55).

The operations may be variously predetermined according to the bending direction of the organic light emitting diode display. Two operations may be predetermined to be opposite to each other as shown in FIG. 8, or to not be opposite to each other. Alternatively, a user may predetermine two operations according to the type of the organic light emitting diode display.

Hereinafter, a sensing operation of pressing will be described with reference to FIG. 9 and FIG. 10.

FIG. 9 shows how the organic light emitting diode display is pressed in accordance with the present example embodiment, and FIG. 10 is a flowchart showing pressing sensing and its operation when the organic light emitting diode display is pressed in accordance with the present example embodiment.

As shown in FIG. 9, the insulation substrate of the organic light emitting diode display is made of a material such as plastic to be flexible. Accordingly, the organic light emitting diode display is pressed and bent when a user presses it. When the organic light emitting diode display is pressed, the pair of lower electrodes 451 and 452 of the sensor B comes into contact with the conductive spacer 475, whereby a voltage level is changed in the pair of lower electrodes 451 and 452. Accordingly, the ambient potential is changed in the piezoelectric material layer 430. As a result, the piezoelectric material layer 430 is vibrated. The vibration causes the organic light emitting diode display to be vibrated, and a user perceives a haptic characteristic. In this case, an alternating current may be applied for vibrating the piezoelectric material layer 430. A common voltage may be applied to the conductive spacer 475.

In another example embodiment, a sensing unit (not shown) may sense the change of the pair of lower electrodes 451 and 452 of the sensor B and provide a pertinent operation. The pertinent operation may correspond to a haptic characteristic such as vibration. In this case, as shown in FIG. 9, the sensor B may not include the upper electrode 400 and the piezoelectric material layer 430 since they are not essential to the sensor B.

FIG. 10 is a flowchart showing an example of a sensing operation of the sensor B.

First, when a user presses the organic light emitting diode display by using his or her finger (S60), the pair of lower electrodes 451 and 452 come into contact with the conductive spacer 475 (S70).

The voltage is changed in the pair of lower electrodes 451 and 452 by the contact, thereby changing an electrical field supplied to the piezoelectric material layer 430. As a result, the piezoelectric material layer 430 is vibrated (S80). In this case, an alternating current may be applied for vibrating the piezoelectric material layer 430.

In another example embodiment, only one of the pair of lower electrodes 451 and 452 may come into contact with the conductive spacer 475, or the pair of lower electrodes 451 and 452 may be formed as a single electrode.

An organic light emitting diode display in accordance with another example embodiment will be described with reference to FIG. 11 to FIG. 15.

Figure 11:
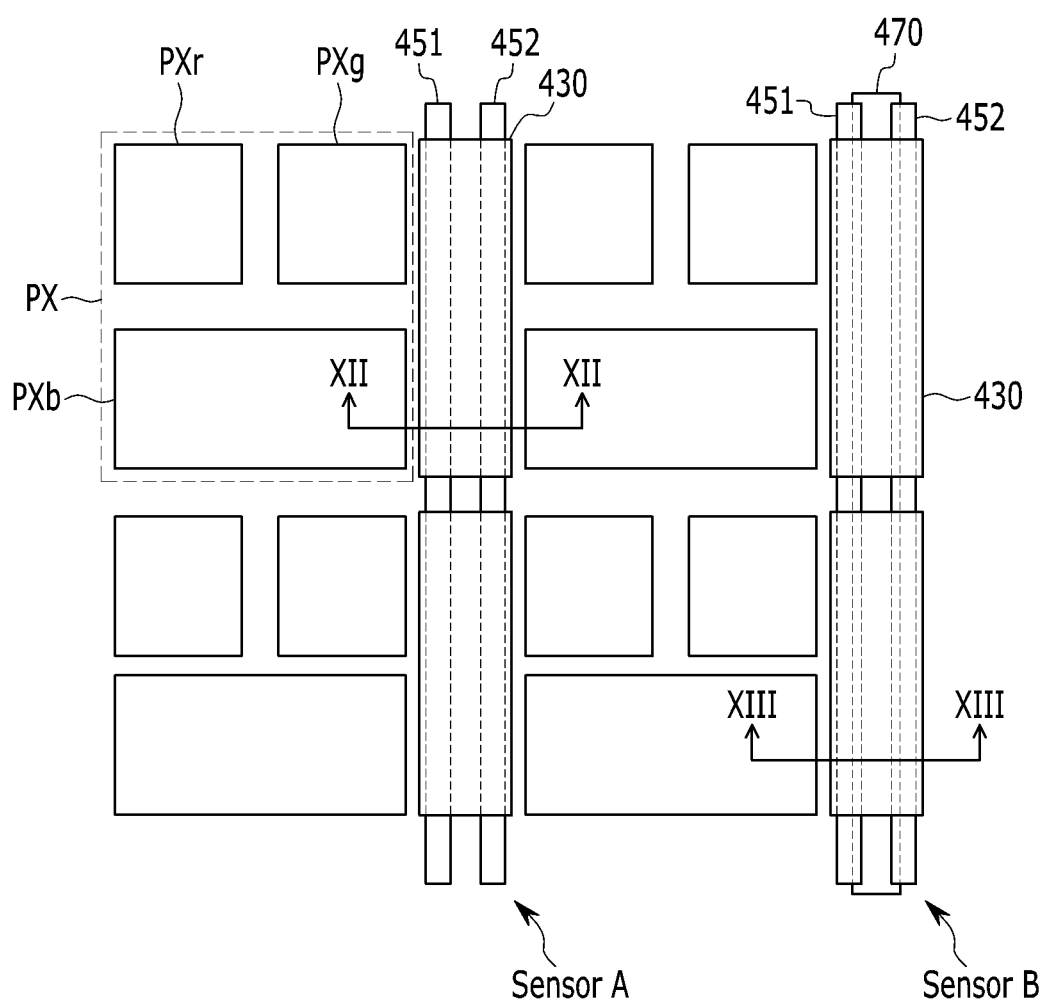
FIG. 11 is a layout view showing a pixel and a sensor in an organic light emitting diode display in accordance with another example embodiment.

As shown in FIG. 11, the sensor A and the sensor B in the organic light emitting diode display include no upper electrode, but include two lower electrodes instead.

Figure 12:
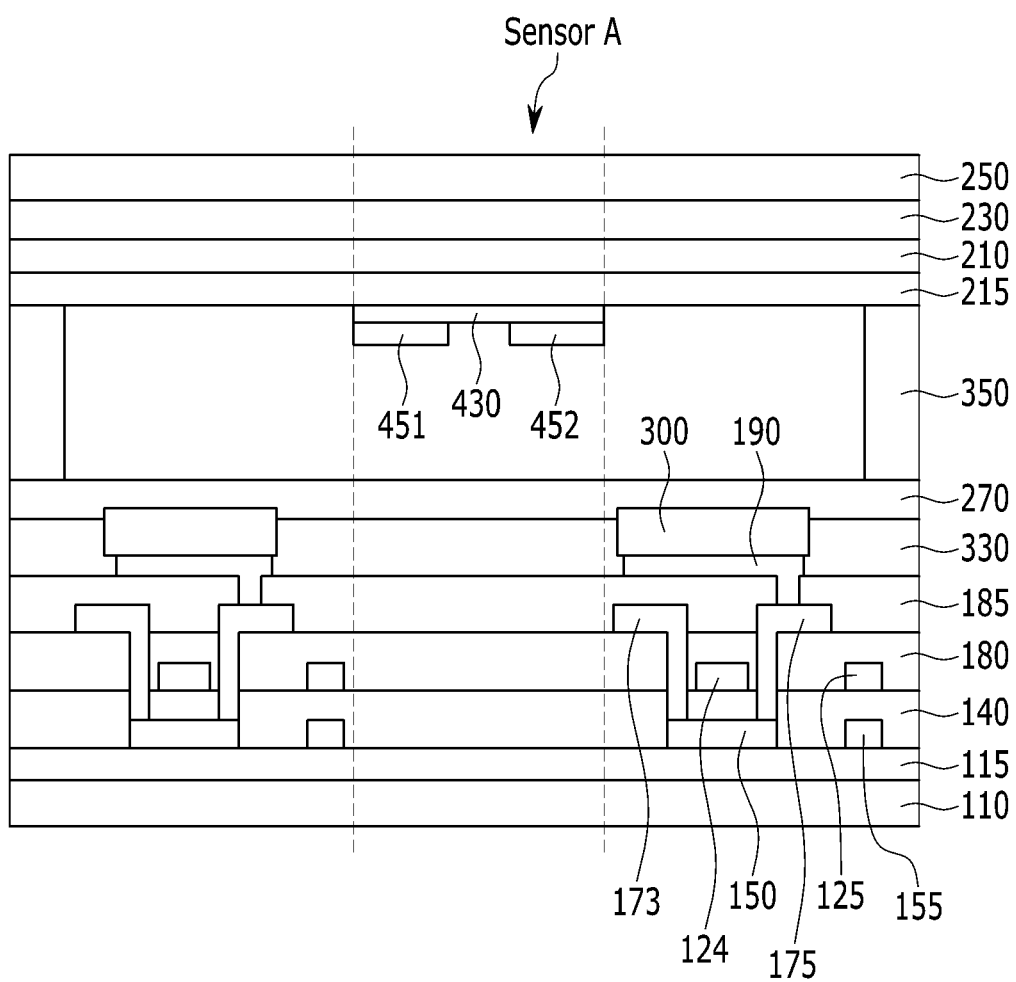
FIG. 12 is a cross-sectional view taken along a line XII-XII of FIG. 11.
Figure 13:
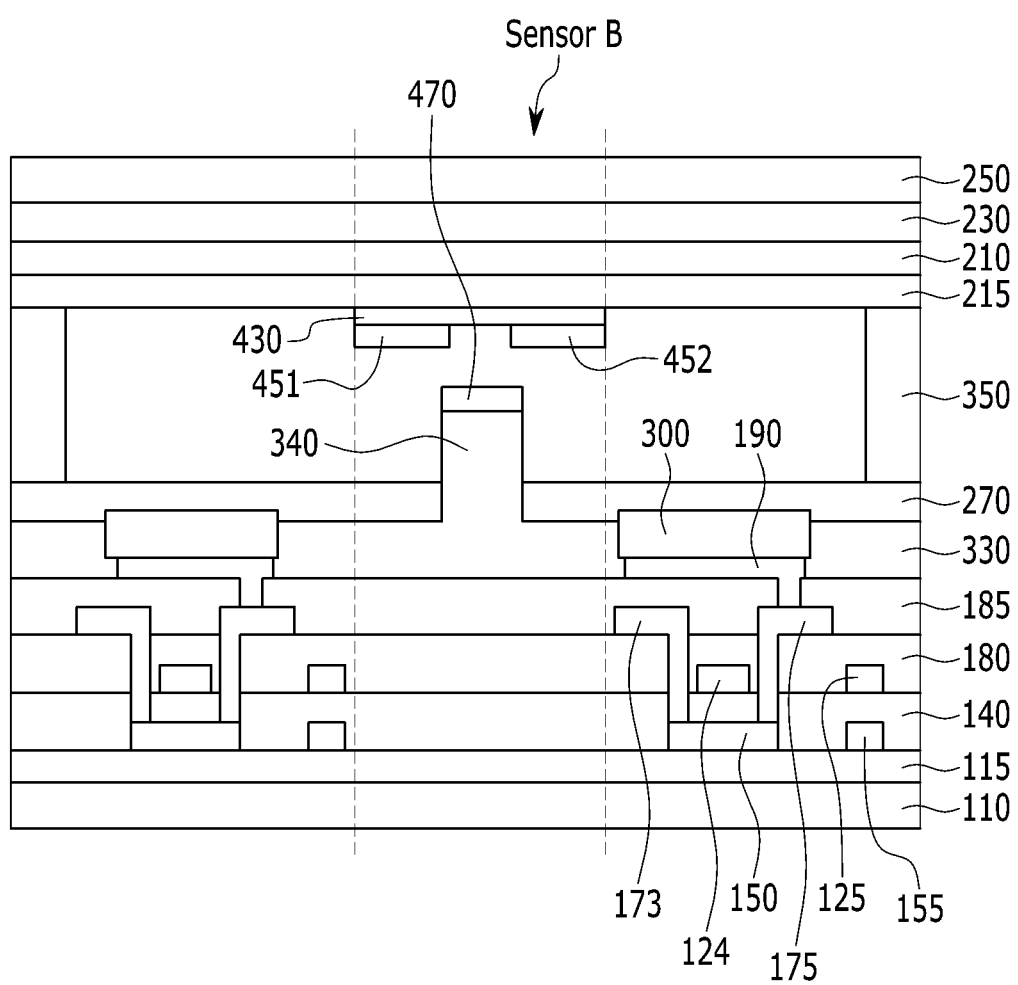
FIG. 13 is a cross-sectional view taken along a line XIII-XIII of FIG. 11.

FIG. 11 is a layout view showing a pixel and a sensor in the organic light emitting diode display in accordance with the present example embodiment, FIG. 12 is a cross-sectional view taken along a line XII-XII of FIG. 11, and FIG. 13 is a cross-sectional view taken along a line XIII-XIII of FIG. 11.

As illustrated in FIG. 11, the organic light emitting diode display of the present example embodiment includes a red pixel PXr, a green pixel PXg, and a blue pixel PXb in a unit pixel PX.

The red pixel PXr and the green pixel PXg are positioned to be horizontally adjacent to each other, and the blue pixel PXb is located below the red pixel PXr and the green pixel PXg. The widths of the red pixel PXr and the green pixel PXg are narrower than that of the blue pixel PXb, and the width of the blue pixel PXb corresponds to the widths of the red pixel PXr and the green pixel PXg and the distance therebetween. An arrangement of pixels in the unit pixel PX shown in FIG. 11 may be varied depending on the example embodiments.

Unit pixels PX having the aforementioned structure are arranged in a matrix shape in row and column directions.

The organic light emitting diode display in accordance with the present example embodiment includes two sensors A and B extended in a vertical direction.

The sensor A serves as a bending sensing sensor including a piezoelectric material layer, and the sensor B serves as a pressing sensing sensor including a piezoelectric material layer. The sensor A includes a pair of electrodes and one piezoelectric material layer 430, and is positioned inside an upper insulation substrate 210. The sensor B includes three electrodes and one piezoelectric material layer 430, one electrode is located inside a lower insulation substrate 110 to protrude upwardly, and the other electrodes are located inside an upper insulation substrate 210. In accordance with another example embodiment, the sensor B may only include a pair of electrodes. In this case, the pair of electrodes may be disposed to be separated from each other, and may be brought into contact with each other when one of the electrodes is pressed.

The sensors A and B may be extended in a vertical direction to an end of a display area of the organic light emitting diode display.

FIG. 12 is a cross-sectional view shown based on the sensor A, and FIG. 13 is a cross-sectional view shown based on the sensor B.

First, the structure of the pixel PX (the red pixel PXr, the green pixel PXg, and the blue pixel PXb) will be described with reference to FIG. 12 and FIG. 13.

One pixel includes an organic light emission layer 300, a pixel electrode 190 is positioned below the organic light emission layer 300, and a common electrode 270 is positioned above the organic light emission layer 300. The pixel electrode 190 may be separately formed for every pixel, and the common electrode 270 may be formed as a single unit in all the pixels.

The pixel electrode 190 may be connected to an output terminal (drain electrode) of a thin film transistor such as a driving transistor to receive an output current of the driving transistor.

The thin film transistor such as the driving transistor includes a polycrystalline semiconductor layer 150, a source electrode 173, a drain electrode 175, and a gate electrode 124.

One pixel may include a capacitor connected to the gate electrode 124 and the source electrode 173 of the driving transistor. The capacitor may comprise the doped polycrystalline semiconductor 155, an upper capacitor electrode 125 made of the same material at the same layer as those of the gate electrode 124, and an insulating layer (gate insulating layer 140) positioned therebetween.

One pixel is illustrated as including one thin film transistor in FIG. 12 and FIG. 13, but actually includes at least two thin film transistors. When a pixel includes the minimum number of thin film transistors, the pixel only includes a switching transistor and a driving transistor, and may further include a light emission transistor for adjusting a light emission time of the organic light emission layer 300.

The lower panel of the above-mentioned structure will be sequentially described as follows.

A buffer layer 115 is formed on the lower insulation substrate 110. Herein, the lower insulation substrate 110 is made of a flexible material such as plastic. The polycrystalline semiconductor layer 150 and the doped polycrystalline semiconductor 155 are formed on the buffer layer 115. The doped polycrystalline semiconductor 155 may have a conductive layer characteristic by high-concentration doping instead of a semiconductor characteristic. The buffer layer 115 serves to prevent inflow of impurities from the lower insulation substrate 110 into the semiconductor when a crystallization process is performed to form a polycrystalline semiconductor.

The polycrystalline semiconductor layer 150, the doped polycrystalline semiconductor 155, and the exposed buffer layer 115 are covered by the gate insulating layer 140. The gate insulating layer 140 may be made of an inorganic material or an organic material.

The gate electrode 124 and the upper capacitor electrode 125 are formed on the gate insulating layer 140. The gate electrode 124 is partially overlapped with the polycrystalline semiconductor layer 150, and the upper capacitor electrode 125 is overlapped with the doped polycrystalline semiconductor 155.

The gate electrode 124, the upper capacitor electrode 125, and the exposed gate insulating layer 140 are covered with the interlayer insulating layer 180. The interlayer insulating layer 180 may be made of an organic material or an inorganic material.

The interlayer insulating layer 180 and the gate insulating layer 140 expose a source region and a drain source of the polycrystalline semiconductor layer 150 through a contact hole. The source electrode 173 and the drain electrode 175 are formed on the interlayer insulating layer 180, and the contact hole and its periphery. The source electrode 173 contacts the source region of the polycrystalline semiconductor layer 150, and the drain electrode 175 contacts the drain region of the polycrystalline semiconductor layer 150.

A passivation layer 185 is formed on the source electrode 173, the drain electrode 175, and the interlayer insulating layer 180. The passivation layer 185 is made of an organic material or an inorganic material. The passivation layer 185 has a contact hole through which the drain electrode 175 is exposed. The pixel electrode 190 is formed on the passivation layer 185, and the contact hole and its periphery. The pixel electrode 190 is connected to the drain electrode 175 through the contact hole.

A pixel definition layer (PDL) 330 is formed around the pixel electrode 190, and includes a plurality of openings corresponding to one pixel. The pixel electrode 190 is exposed at a portion at which no pixel definition layer 330 is formed, and the organic light emission layer 300 is positioned on the pixel electrode 190. The organic light emission layer 300 may include a plurality of organic layers to emit light of different colors depending on kinds of the organic material.

Referring to FIG. 13, a part of the pixel definition layer 330 further includes a projection 340, and a protrusion electrode 470 of the sensor B is positioned at an upper portion of the projection 340. The projection 340 and the protrusion electrode 470 are extended in the vertical direction. Alternatively, the conductive spacer 475 may be extended to cross an entire area of the display area in accordance with another example embodiment. Further alternatively, the conductive spacer 475 may have disconnected portions at regions of the display area in accordance with yet another example embodiment. The protrusion electrode 470 is floated.

The organic light emission layer 300 and the pixel definition layer 330 are covered by the common electrode 270, except at the protrusion electrode 470.

At least one of the pixel electrode 190 and the common electrode 270 is made of a transparent conductive material. This is to provide light emitted from the organic light emission layer 300 to the eye of a user through the transparent conductive material. In organic light emitting diode display of the present example embodiment, the common electrode 270 may be made of a transparent conductive material, and the pixel electrode 190 may be made of an opaque metal.

The lower panel has such a layered structure.

Hereinafter, a structure of the upper panel will be described.

First, a touch screen panel 230 is attached on the upper insulation substrate 210. Herein, the lower insulation substrate 110 is made of a flexible material such as plastic.

The touch screen panel 230 may have such a structure so as to sense a hand touch in various ways such as an optical type, a resistive type, a contact type, and a capacitive type. However, the touch screen panel 230 may not be attached thereto.

A window 250 for protecting the touch screen panel 230 is formed, and the lower panel is attached on the window 250. The window 250 and the touch screen panel 230 are also flexible.

An upper insulation substrate 210 is formed inside the buffer layer 215.

This structure is to support and protect the sensor A and the sensor B, and may be varied depending on the example embodiments.

Hereinafter, each structure of the sensor A and the sensor B will be described.

First, a cross-sectional structure of the sensor A is shown in FIG. 12.

The sensor A include a piezoelectric material layer 430 formed inside the buffer layer 215. The piezoelectric material layer 430 is formed to correspond to a portion at which the pixel definition layer 330 of the lower panel is formed. This is also to prevent the opening of the pixel definition layer 330 from being covered since the light emitted from the organic light emission layer 300 passes through the opening. Referring to FIG. 11, the pixel definition layer 330 is formed to vertically extend, and has a length corresponding to the length of the pixel PX. Alternatively, the pixel definition layer 330 may be formed to vertically extend to correspond to the length of several pixels, several tens of pixels, or all the pixels. The piezoelectric material layer 430 includes a piezoelectric material, and may include a material such as $BaTiO_3$, $SrTiO_3$, $PbTiO_3$, and $CaTiO_3$. Further, the piezoelectric material layer 430 may include an organic material such as PVDF. Herein, when an organic material (e.g., PVDF) is employed as the piezoelectric material layer 430, it is not necessary to perform a laser crystallization process on the piezoelectric material layer 430. When an inorganic material is employed as the piezoelectric material layer 430, it is necessary to perform the laser crystallization process on the piezoelectric material layer 430.

A pair of lower electrodes 451 and 452 are positioned below the piezoelectric material layer 430

The pair of lower electrodes 451 and 452 are formed to correspond to a portion at which the pixel definition layer 330 of the lower panel is formed and to extend in the vertical direction while partially coming into contact with the piezoelectric material layer 430. The pair of lower electrodes 451 and 452 are extended to vertically extend at a portion at which the piezoelectric material layer 430 is not formed, and may be made of an opaque metal layer such as Mo, Cu, Cr, Ti, and W.

As a result, the sensor A includes the pair of lower electrodes 451 and 452 and the piezoelectric material layer 430 positioned thereon. In the present example embodiment, in the piezoelectric material layer 430, a plurality of unit structures are arranged in the vertical direction, and the pair of lower electrodes 451 and 452 are formed to vertically cross the entire display area.

A cross-sectional structure of the sensor B is shown in FIG. 13.

The sensor B includes the piezoelectric material layer 430 formed inside the buffer layer 215. The piezoelectric material layer 430 is formed to correspond to a portion at which the pixel definition layer 330 of the lower panel is formed. This is also to prevent the opening of the pixel definition layer 330 from being covered since the light emitted from organic light emission layer 300 passes through the opening. Referring to FIG. 11, the piezoelectric material layer 430 is formed to vertically extend, and has a length corresponding to the length of the pixel PX. Alternatively, the pixel definition layer 330 may be formed to vertically extend to correspond to the length of several pixels, several tens of pixels, or all the pixels.

The pair of lower electrodes 451 and 452 are positioned below the piezoelectric material layer 430. The pair of lower electrodes 451 and 452 are formed to correspond to a portion at which the pixel definition layer 330 of the lower panel is formed and to extend in the vertical direction while partially coming into contact with the piezoelectric material layer 430. The pair of lower electrodes 451 and 452 are extended to vertically extend at a portion at which the piezoelectric material layer 430 is not formed, and may be made of an opaque metal layer.

Further, the sensor B may include the protrusion electrode 470 positioned in the lower panel.

As a result, the sensor B includes the pair of lower electrodes 451 and 452 and the protrusion electrode 470 as three electrodes, and the piezoelectric material layer 430 positioned above the pair of lower electrodes 451 and 452. In the present example embodiment, in the piezoelectric material layer 430, a plurality of unit structures vertically extended are arranged in the vertical direction, and the pair of lower electrodes 451 and 452 are formed to vertically cross the entire display area. Further, the protrusion electrode 470 is also vertically extended in the lower panel.

Hitherto, the structure of the upper panel has been described.

The lower panel and the upper panel are attached by using a sealing member 350, and the inside is sealed.

Hereinafter, a manufacturing method of main parts of the organic light emitting diode display having the aforementioned structure will be briefly described with reference FIG. 14 and FIG. 15.

Figure 14:
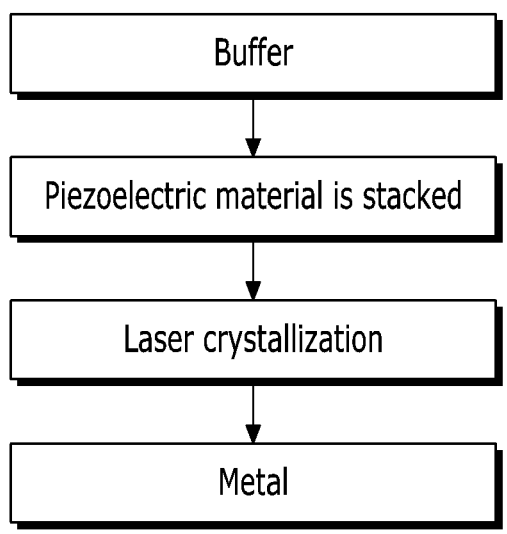
FIG. 14 and FIG. 15 are flowcharts briefly showing a manufacturing method in accordance with an example of FIG. 11.
Figure 15:
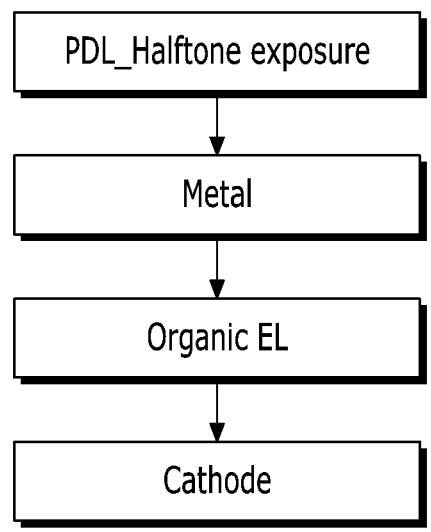

FIG. 14 and FIG. 15 are flowcharts briefly showing a manufacturing method in accordance with an example of FIG. 11.

First, FIG. 14 shows a flowchart showing a manufacturing method of the upper panel.

The buffer layer 215 is formed inside the upper insulation substrate 210. Then, a vibration material (e.g., BT, PT, PZT, or the like) such as a piezoelectric material is stacked. Next, the stacked vibration material is crystallized by using a laser. The crystallized vibration material is etched to complete it as the piezoelectric material layer 430. The reason for crystallizing it by using a laser is to prevent the upper insulation substrate 210 made of a flexible material such as plastic from being affected by a high temperature treatment, and the buffer layer 215 is also formed to protect the upper insulation substrate 210.

When an organic material such as PVDF is employed as the piezoelectric material layer 430, it is not necessary to perform a laser crystallization process.

As shown in FIG. 11, no upper electrode comprising a transparent electrode made of ITO or the like is included. Accordingly, since the ITO that may be cracked by the laser crystallization process is not included, there is no problem to use the laser crystallization process.

Next, the pair of lower electrodes 451 and 452 are formed.

FIG. 15 is a flowchart briefly showing a manufacturing method of the lower panel.

FIG. 15 illustrates an order of forming the projection 340 and the protrusion electrode 470 in detail.

A material for the pixel definition layer 330 is stacked and halftone-exposed to form the pixel definition layer 330, the projection 340, and an opening of the pixel definition layer 330 having different heights by using one mask.

Then, a metal is stacked and etched to maintain the metal only on the projection 340, thereby completing the projection 340.

Next, the organic light emission layer 300 is formed in the opening of the pixel definition layer 330.

Thereafter, the common electrode (cathode) 270 is formed to cover the organic light emission layer 300 and the pixel definition layer 330 except at the projection 340.

The organic light emitting diode display in accordance with the example of FIG. 11 can sense the bending and the pressing as shown in FIG. 7 to FIG. 10, which is not additionally described.

Hereinafter, an organic light emitting diode display in accordance with yet another example embodiment will be described in detail with reference to FIG. 16 to FIG. 20. First, a structure of the organic light emitting diode display in accordance with the present example embodiment will be described with reference to FIG. 16 to FIG. 18.

Figure 16:
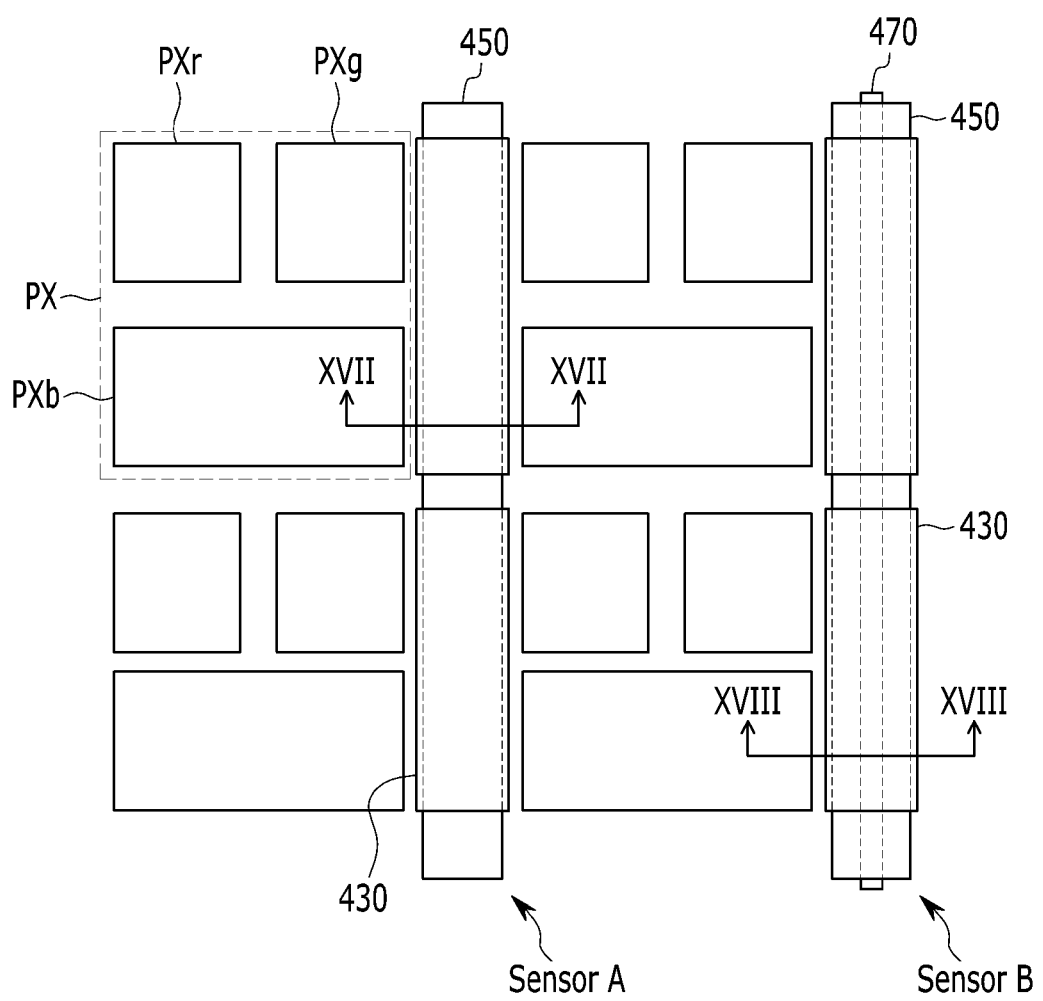
FIG. 16 is a layout view showing a pixel and a sensor in an organic light emitting diode display in accordance with yet another example embodiment.
Figure 17:
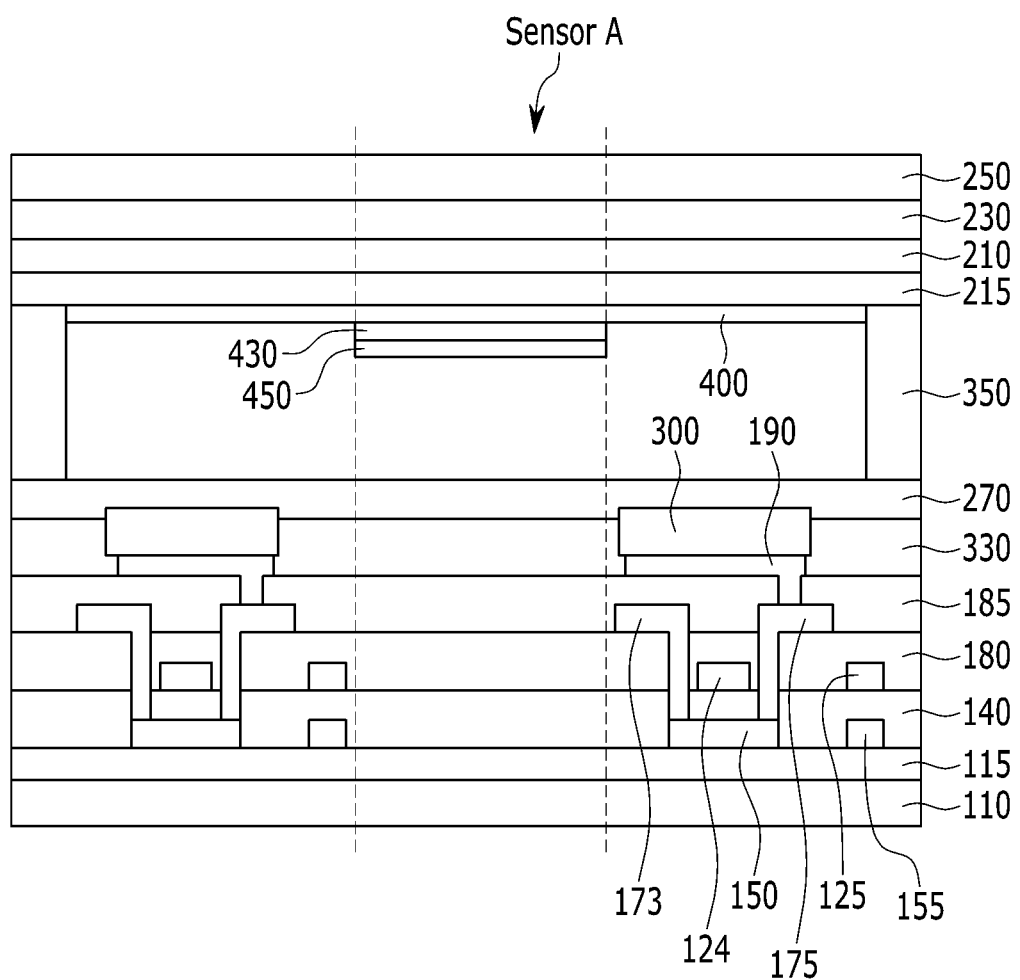
FIG. 17 is a cross-sectional view taken along a line XVII-XVII of FIG. 16.
Figure 18:
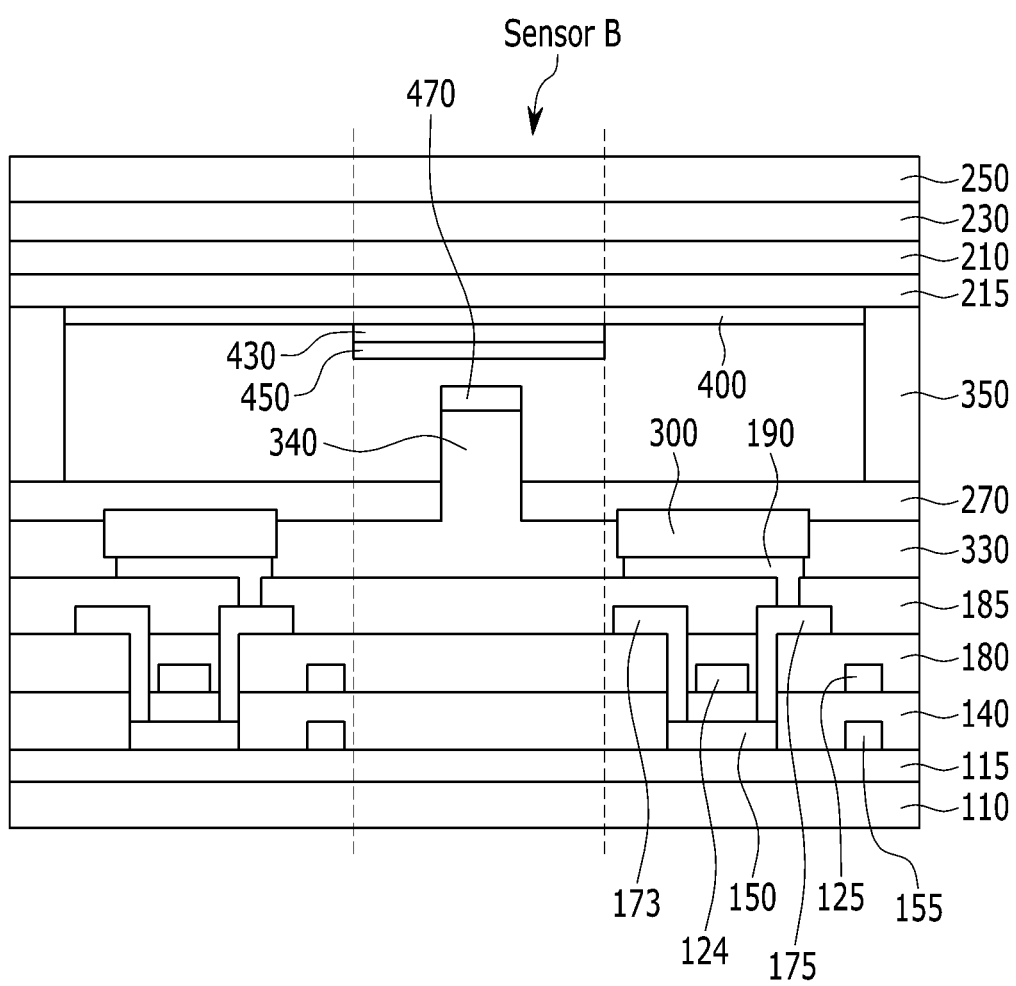
FIG. 18 is a cross-sectional view taken along a line XVIII-XVIII of FIG. 16.

FIG. 16 is a layout view showing a pixel and a sensor in the organic light emitting diode display in accordance with the present example embodiment, FIG. 17 is a cross-sectional view taken along a line XVII-XVII of FIG. 16, and FIG. 18 is a cross-sectional view taken along a line XVIII-XVIII of FIG. 16.

As illustrated in FIG. 16, the organic light emitting diode display of the present example embodiment includes a red pixel PXr, a green pixel PXg, and a blue pixel PXb in a unit pixel PX.

The red pixel PXr and the green pixel PXg are positioned to be adjacent to each other horizontally, and the blue pixel PXb is located below the red pixel PXr and the green pixel PXg. The widths of the red pixel PXr and the green pixel PXg are narrower than that of the blue pixel PXb, and the width of the blue pixel PXb corresponds to the widths of the red pixel PXr and the green pixel PXg and the distance therebetween. An arrangement of pixels in the unit pixel PX shown in FIG. 16 may be varied depending on the example embodiments.

Unit pixels PX having the aforementioned structure are arranged in a matrix shape in row and column directions.

The organic light emitting diode display in accordance with the present example embodiment includes two sensors A and B extended in a vertical direction. In an example of FIG. 16, the sensor A or the sensor B is disposed every row of unit pixel, and the sensor A and the sensor B are alternately disposed. Alternatively, the sensor A or the sensor B may be disposed every several rows.

The sensor A serves as a bending sensing sensor including a piezoelectric material layer, and the sensor B serves as a pressing sensing sensor including a piezoelectric material layer. The sensor A includes a pair of electrodes and one piezoelectric material layer 430, and is positioned inside an upper insulation substrate 210. The sensor B includes three electrodes and one piezoelectric material layer 430, one electrode is located inside a lower insulation substrate 110 to protrude upwardly, and the other electrodes are located inside the upper insulation substrate 210. In accordance with another example embodiment, the sensor B may only include a pair of electrodes. In this case, the pair of electrodes may be disposed to be separated from each other, and may be brought into contact with each other when one of the electrodes is pressed.

The sensors A and B may be extended in a vertical direction to an end of a display area of the organic light emitting diode display.

FIG. 17 is a cross-sectional view shown based on the sensor A, and FIG. 18 is a cross-sectional view shown based on the sensor B.

First, the structure of the pixel PX (the red pixel PXr, the green pixel PXg, and the blue pixel PXb) will be described with reference to FIG. 17 and FIG. 18.

One pixel includes an organic light emission layer 300, a pixel electrode 190 positioned below the organic light emission layer 300, and a common electrode 270 positioned above the organic light emission layer 300. The pixel electrode 190 may be separately formed for every pixel, and the common electrode 270 may be formed as a single unit in all the pixels.

The pixel electrode 190 may be connected to an output terminal (drain electrode) of a thin film transistor such as a driving transistor to receive an output current of the driving transistor.

The thin film transistor such as the driving transistor includes a polycrystalline semiconductor layer 150, a source electrode 173, a drain electrode 175, and a gate electrode 124.

One pixel may include a capacitor connected to the gate electrode 124 and the source electrode 173 of the driving transistor. The capacitor may comprise the doped polycrystalline semiconductor 155, an upper capacitor electrode 125 made of the same material at the same layer as those of the gate electrode 124, and an insulating layer (gate insulating layer 140) positioned therebetween.

One pixel is illustrated as including one thin film transistor in FIG. 17 and FIG. 18, but actually includes at least two thin film transistors. When a pixel includes the minimum number of thin film transistors, the pixel only includes a switching transistor and a driving transistor, and may further include a light emission transistor for adjusting a light emission time of the organic light emission layer 300.

The lower panel of the above-mentioned structure will be sequentially described as follows.

A buffer layer 115 is formed on the lower insulation substrate 110. Herein, the lower insulation substrate 110 is made of a flexible material such as plastic. The polycrystalline semiconductor layer 150 and the doped polycrystalline semiconductor 155 are formed on the buffer layer 115. The doped polycrystalline semiconductor 155 may have a conductive layer characteristic by high-concentration doping instead of a semiconductor characteristic. The buffer layer 115 serves to prevent inflow of impurities from the lower insulation substrate 110 into the semiconductor when a crystallization process is performed to form a polycrystalline semiconductor.

The polycrystalline semiconductor layer 150, the doped polycrystalline semiconductor 155, and the exposed buffer layer 115 are covered by the gate insulating layer 140. The gate insulating layer 140 may made of an inorganic material or an organic material.

The gate electrode 124 and the upper capacitor electrode 125 are formed on the gate insulating layer 140. The gate electrode 124 is partially overlapped with the polycrystalline semiconductor layer 150, and the upper capacitor electrode 125 is overlapped with the doped polycrystalline semiconductor 155.

The gate electrode 124, the upper capacitor electrode 125, and the exposed gate insulating layer 140 are covered with the interlayer insulating layer 180. The interlayer insulating layer 180 may be made of an organic material or an inorganic material.

The interlayer insulating layer 180 and the gate insulating layer 140 expose a source region and a drain source of the polycrystalline semiconductor layer 150 through a contact hole. The source electrode 173 and the drain electrode 175 are formed on the interlayer insulating layer 180, and the contact hole and its periphery. The source electrode 173 contacts the source region of the polycrystalline semiconductor layer 150, and the drain electrode 175 contacts the drain region of the polycrystalline semiconductor layer 150.

A passivation layer 185 is formed on the source electrode 173, the drain electrode 175, and the interlayer insulating layer 180. The passivation layer 185 is made of an organic material or an inorganic material. The passivation layer 185 has a contact hole through which the drain electrode 175 is exposed. The pixel electrode 190 is formed on the passivation layer 185, and the contact hole and its periphery. The pixel electrode 190 is connected to the drain electrode 175 through the contact hole.

A pixel definition layer (PDL) 330 is formed around the pixel electrode 190, and includes a plurality of openings corresponding to one pixel. The pixel electrode 190 is exposed at a portion at which no pixel definition layer 330 is formed, and the organic light emission layer 300 is positioned on the pixel electrode 190. The organic light emission layer 300 may include a plurality of organic layers to emit light of different colors depending on kinds of the organic material.

Referring to FIG. 18, a part of the pixel definition layer 330 further includes a projection 340, and a protrusion electrode 470 of the sensor B is positioned at an upper portion of the projection 340. The projection 340 and the protrusion electrode 470 are extended in the vertical direction. Alternatively, the conductive spacer 475 may be extended to cross an entire area of the display area in accordance with another example embodiment. Further alternatively, the conductive spacer 475 may have disconnected portions at regions of the display area in accordance with yet another example embodiment. The protrusion electrode 470 is floated.

The organic light emission layer 300 and the pixel definition layer 330 are covered by the common electrode 270, except at the protrusion electrode 470.

At least one of the pixel electrode 190 and the common electrode 270 is made of a transparent conductive material. This is to provide light emitted from the organic light emission layer 300 to the eye of a user through the transparent conductive material. In organic light emitting diode display of the present example embodiment, the common electrode 270 may be made of a transparent conductive material, and the pixel electrode 190 may be made of an opaque metal.

The lower panel has such a layered structure.

Hereinafter, a structure of the upper panel will be described.

First, a touch screen panel 230 is attached on the upper insulation substrate 210. Herein, the lower insulation substrate 110 is made of a flexible material such as plastic.

The touch screen panel 230 may have such a structure so as to sense a hand touch in various ways such as an optical type, a resistive type, a contact type, and a capacitive type. However, the touch screen panel 230 may not be attached thereto.

A window 250 for protecting the touch screen panel 230 is formed, and the lower panel is attached on the window 250. The window 250 and the touch screen panel 230 are also flexible.

An upper buffer layer 215 is formed inside the buffer layer 215.

This structure is used to support and protect the sensor A and sensor B, and may be varied depending on the example embodiments.

Hereinafter, each structure of the sensor A and the sensor B will be described.

First, a cross-sectional structure of the sensor A is shown in FIG. 17.

The sensor A include an upper electrode 400 formed inside the buffer layer 215. The upper electrode 400 is made of a transparent conductive material, and is entirely formed below the buffer layer 215. As a result, the upper electrode 400 can be shared by the sensor A and the sensor B. The sensor A may include the upper electrode 400 divided per sensor in accordance with another example embodiment. The upper electrode 400 may be made of a transparent conductive material such as ITO, IZO, GIZO, carbon nanotubes, or graphene.

The piezoelectric material layer 430 is positioned below the upper electrode 400. The piezoelectric material layer 430 is formed to correspond to a portion at which the pixel definition layer 330 of the lower panel is formed. This is also to prevent the opening of the pixel definition layer 330 from being covered since the light emitted from the organic light emission layer 300 passes through the opening. Referring to FIG. 16, the pixel definition layer 330 is formed to vertically extend, and has a length corresponding to the length of the pixel PX. Alternatively, the pixel definition layer 330 may be formed to vertically extend to correspond to the length of several pixels, several tens of pixels, or all the pixels. The piezoelectric material layer 430 includes a piezoelectric material, and may include a material such as $BaTlO_3$, $SrTlO_3$, $PbTiO_3$, and $CaTiO_3$. Further, the piezoelectric material layer 430 may include an organic material such as PVDF. Herein, when an organic material (e.g., PVDF) is employed as the piezoelectric material layer 430, it is not necessary to perform a laser crystallization process on the piezoelectric material layer 430. When an inorganic material is employed as the piezoelectric material layer 430, it is necessary to perform the laser crystallization process on the piezoelectric material layer 430.

A lower electrode 450 is positioned below the piezoelectric material layer 430. The lower electrode 450 is formed to correspond to a portion at which the pixel definition layer 330 of the lower panel is formed. The lower electrode 450 may comprise an opaque metal layer made of an opaque metal layer such as Mo, Cu, Cr, Ti, and W.

As a result, the sensor A includes the upper electrode 400 and the lower electrode 450 as a pair of electrodes and the piezoelectric material layer 430 positioned therebetween. In the present example embodiment, in the piezoelectric material layer 430, a plurality of unit structures are arranged in the vertical direction, and the upper electrode 400 and the lower electrode 450 are formed to vertically cross the entire display area.

A cross-sectional structure of the sensor B is shown in FIG. 18.

The sensor B include an upper electrode 400 formed inside the buffer layer 215. The upper electrode 400 is made of a transparent conductive material, and is entirely formed below the buffer layer 215. As a result, the upper electrode 400 can be shared by the sensor A and the sensor B.

The piezoelectric material layer 430 is positioned below the upper electrode 400. The piezoelectric material layer 430 is formed to correspond to a portion at which the pixel definition layer 330 of the lower panel is formed.

A lower electrode 450 is positioned below the piezoelectric material layer 430. The lower electrode 450 is formed to correspond to a portion at which the pixel definition layer 330 of the lower panel is formed. The lower electrode 450 may comprise an opaque metal layer made of an opaque metal such as Mo, Cu, Cr, Ti, and W.

Further, the sensor B may include a protrusion electrode 470 positioned in the lower panel.

As a result, the sensor B includes the upper electrode 400, the lower electrode 450, and the protrude electrode 470 as three electrodes, and the piezoelectric material layer 430 positioned between the upper electrode 400 and the lower electrode 450. In the present example embodiment, the upper electrode 400 is entirely formed in the upper electrode 400, and in the piezoelectric material layer 430, a plurality of unit structures are arranged in the vertical direction, and the lower electrode 450 is formed to vertically cross the entire display area. Further, the protrusion electrode 470 is also vertically extended in the lower panel.

Hitherto, the structure of the upper panel has been described.

The lower panel and the upper panel are attached by using a sealing member 350, and the inside is sealed.

Hereinafter, a manufacturing method of main parts of the organic light emitting diode display having the aforementioned structure will be briefly described with reference to FIG. 19 and FIG. 20.

Figure 19:
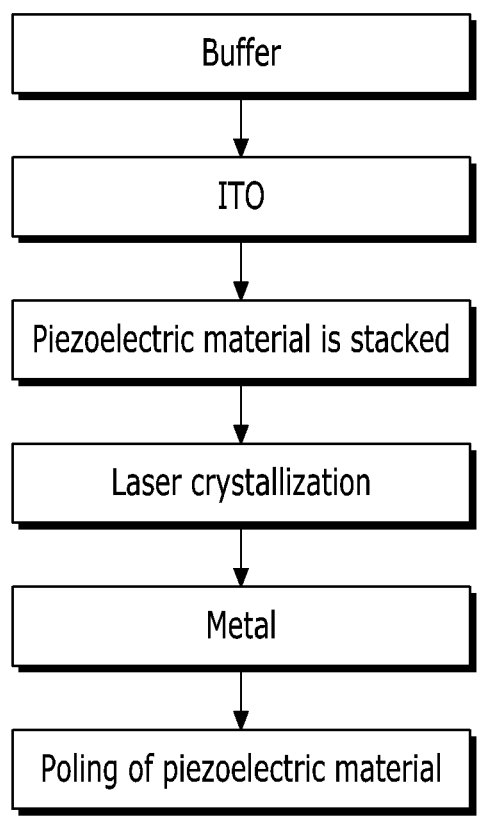
FIG. 19 and FIG. 20 are flowcharts briefly showing a manufacturing method in accordance with an example of FIG. 16.
Figure 20:
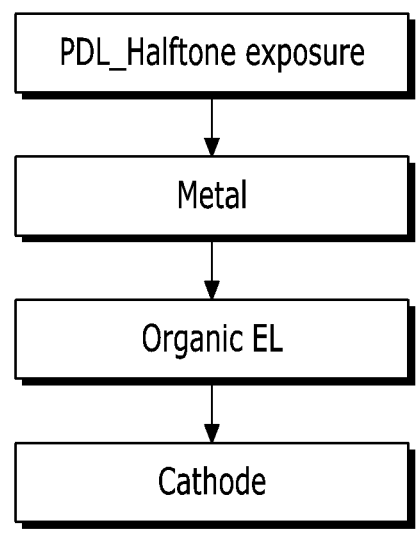

FIG. 19 and FIG. 20 are flowcharts briefly showing a manufacturing method in accordance with an example of FIG. 16.

First, FIG. 19 shows a flowchart of a manufacturing method of the upper panel.

The buffer layer 215 is formed inside the upper insulation substrate 210. Then, the upper electrode 400 is made of a transparent conductive material such as ITO inside the buffer layer 215.

Then, a vibration material such as piezoelectric material is stacked. Next, the stacked vibration material is crystallized by using a laser. The crystallized vibration material is etched to complete it as the piezoelectric material layer 430. The reason for crystallizing it by using a laser is to prevent the upper insulation substrate 210 made of a flexible material such as plastic from being affected by a high temperature treatment, and the buffer layer 215 is also formed to protect the upper insulation substrate 210.

When an organic material such as PVDF is employed as the piezoelectric material layer 430, it is not necessary to perform a laser crystallization process.

An ITO that can be used as the upper electrode 400 can be crystallized along with the vibration material by the laser crystallization process. If the ITO is cracked or contaminated by the laser crystallization process, the example of FIG. 11 can be applied.

Thereafter, the lower electrode 450 is formed, and the piezoelectric material layer 430 may be subjected to a high temperature treatment through a poling process. However, the poling process may be omitted since the laser crystallization process has already been performed.

FIG. 20 is a flowchart briefly showing a manufacturing method of the lower panel.

FIG. 20 illustrates an order of forming the projection 340 and the protrusion electrode 470 in detail.

A material for the pixel definition layer 330 is stacked and halftone-exposed to form the pixel definition layer 330, the projection 340, and an opening of the pixel definition layer 330 having different heights by using one mask.

Then, a metal is stacked and etched to maintain the metal on the projection 340 only, thereby completing the projection 340.

Next, the organic light emission layer 300 is formed in the opening of the pixel definition layer 330.

Thereafter, the common electrode (cathode) 270 is formed to cover the organic light emission layer 300 and the pixel definition layer 330 except at the projection 340.

The organic light emitting diode display manufactured by using the aforementioned structure and the manufacturing method can sense the bending as shown in FIG. 7 and FIG. 8 and sense the pressing as shown in FIG. 9 and FIG. 10.

While the present embodiments have been described in connection with what is presently considered to be practical example embodiments, it is to be understood that the present embodiments are not limited to the disclosed embodiments, but, on the contrary, are intended to cover various modifications and equivalent arrangements included within the spirit and scope of the appended claims.

What is claimed is:

1. An organic light emitting diode display comprising:
   a flexible upper substrate;
   a first piezoelectric material layer and a second piezoelectric material layer formed inside the upper substrate;
   a pair of first electrodes brought into contact with the first piezoelectric material layer;
   a pair of second electrodes brought into contact with the second piezoelectric material layer;
   a flexible lower substrate facing the upper substrate, and having an organic light emission layer; and
   an opposed electrode protruding toward an inner side of the lower substrate and facing the pair of second electrodes,
   wherein a first sensor includes the first piezoelectric material layer and the pair of first electrodes, and a second sensor includes the second piezoelectric material layer, the pair of second electrodes, and the opposed electrode.

2. The organic light emitting diode display of claim 1, wherein the opposed electrode is a conductive spacer.

3. The organic light emitting diode display of claim 2, wherein the lower substrate further includes a pixel definition layer having an opening and a conductive spacer formed on the pixel definition layer, and
   the conductive spacer is the opposed electrode and is formed at a portion corresponding to at least one of a pair of lower electrodes pertaining to the pair of second electrodes.

4. The organic light emitting diode display of claim 3, wherein the pair of first electrodes includes a pair of lower electrodes positioned below the first piezoelectric material layer, and
   the pair of second electrodes include a pair of lower electrodes positioned below the second piezoelectric material layer.

5. The organic light emitting diode display of claim 1, wherein pixels including the organic light emission layer are arranged in a matrix shape in the lower substrate, and the first sensor and the second sensor are formed to cross between the pixels in a vertical direction.

6. The organic light emitting diode display of claim 5, wherein each pixel includes a red pixel, a green pixel, and a blue pixel, and
   the first sensor or the second sensor is disposed in every unit pixel including the red pixel, the green pixel, and the blue pixel.

7. The organic light emitting diode display of claim 1, wherein the pair of first electrodes includes an upper electrode positioned above the first piezoelectric material layer and a lower electrode positioned below the first piezoelectric material layer,
   the pair of second electrodes include an upper electrode positioned above the second piezoelectric material layer and a lower electrode positioned below the second piezoelectric material layer, and
   the lower electrode pertaining to the pair of the first electrodes is electrically separated from the lower electrode pertaining to the pair of second electrodes.

8. The organic light emitting diode display of claim 7, wherein the lower substrate further includes a pixel definition layer having an opening and a projection, and a protrusion electrode formed on the projection,
   the protrusion electrode is the opposed electrode, and the protrusion electrode is formed at a portion corresponding to the lower electrode pertaining to the pair of second electrodes.

9. The organic light emitting diode display of claim 8, wherein the upper electrode pertaining to the pair of first electrodes and the upper electrode pertaining to the pair of second electrodes are connected to each other, and are made of a transparent conductive material.

10. The organic light emitting diode display of claim 1, wherein the pair of first electrodes includes a pair of lower electrodes positioned below the first piezoelectric material layer, and
    the pair of second electrodes includes a pair of lower electrodes positioned below the second piezoelectric material layer.

11. The organic light emitting diode display of claim 10, wherein the lower substrates further include a pixel definition layer having an opening and a projection, and a protrusion electrode formed on the projection,
    the protrusion electrode is the opposed electrode, and the protrusion electrode is formed at a portion corresponding to the lower electrode pertaining to the pair of second electrodes.

12. The organic light emitting diode display of claim 1, wherein the first sensor expands or reduces a screen according to a bending direction of the organic light emitting diode display, and
    the second sensor is vibrated when the organic light emitting diode display is pressed.

13. The organic light emitting diode display of claim 1, wherein one of the pair of first electrodes and one of the pair of second electrodes are made of the same material, and
    the other one of the pair of first electrodes and the other one of the pair of second electrodes are made of the same material.

14. A manufacturing method of an organic light emitting diode display, the method comprising:
    forming a first piezoelectric material layer and a second piezoelectric material layer inside a flexible upper substrate using a piezoelectric material;

forming a first electrode inside the first piezoelectric material layer and a second electrode inside the second piezoelectric material layer;

forming a pixel definition layer having an opening by stacking an organic material inside a flexible lower substrate and performing exposure thereon;

forming a conductive spacer on the pixel definition layer;

forming an organic light emission layer in the opening of the pixel definition layer; and forming a common electrode to cover the pixel definition layer and organic light emission layer except at the projection and a protrusion electrode.

15. The manufacturing method of claim 14, further comprising forming an upper electrode between the upper substrate and the first piezoelectric material layer and the second piezoelectric material layer to be paired with the first electrode and the second electrode, respectively, by using a transparent conductive material.

16. The manufacturing method of claim 14, wherein the first electrode includes a pair of first electrodes, and the second electrode includes a pair of second electrodes.

17. The manufacturing method of claim 14, wherein the forming of the first piezoelectric material layer and the second piezoelectric material layer is performed by depositing the piezoelectric material and crystallizing it with a laser when the piezoelectric material is an inorganic material, and is performed without crystallizing it with a laser when the piezoelectric material is an organic material.

18. A manufacturing method of an organic light emitting diode display, the method comprising:

forming a first piezoelectric material layer and a second piezoelectric material layer inside a flexible upper substrate using a piezoelectric material;

forming a first electrode inside the first piezoelectric material layer and a second electrode inside the second piezoelectric material layer;

forming a pixel definition layer having an opening and a projection by stacking an organic material inside a flexible lower substrate and performing halftone-exposure thereon;

forming a protrusion electrode on the pixel definition layer;

forming an organic light emission layer in the opening of the pixel definition layer; and forming a common electrode to cover the pixel definition layer and organic light emission layer except at the projection and the protrusion electrode.

19. The manufacturing method of claim 18, further comprising forming an upper electrode between the upper substrate and the first piezoelectric material layer and the second piezoelectric material layer to be paired with the first electrode and the second electrode, respectively, by using a transparent conductive material.

20. The manufacturing method of claim 18, wherein the first electrode includes a pair of first electrodes, and the second electrode includes a pair of second electrodes.

21. The manufacturing method of claim 18, wherein the forming of the first piezoelectric material layer and the second piezoelectric material layer is performed by depositing the piezoelectric material and crystallizing it with a laser when the piezoelectric material is an inorganic material, and is performed without crystallizing it with a laser when the piezoelectric material is an organic material.

* * * * *